United States Patent
Tamura

(10) Patent No.: US 12,532,535 B2
(45) Date of Patent: Jan. 20, 2026

(54) SEMICONDUCTOR DEVICE INCLUDING A SILICON SEMICONDUCTOR LAYER AND A NITRIDE SEMICONDUCTOR LAYER

(71) Applicant: ROHM CO., LTD., Kyoto (JP)

(72) Inventor: Yuya Tamura, Kyoto (JP)

(73) Assignee: ROHM CO. LTD., Kyoto (JP)

( * ) Notice: Subject to any disclaimer, the term of this patent is extended or adjusted under 35 U.S.C. 154(b) by 376 days.

(21) Appl. No.: 18/024,296

(22) PCT Filed: Aug. 26, 2021

(86) PCT No.: PCT/JP2021/031393
§ 371 (c)(1),
(2) Date: Mar. 2, 2023

(87) PCT Pub. No.: WO2022/054600
PCT Pub. Date: Mar. 17, 2022

(65) Prior Publication Data
US 2023/0317716 A1    Oct. 5, 2023

(30) Foreign Application Priority Data
Sep. 8, 2020  (JP) .................................. 2020-150774

(51) Int. Cl.
*H10D 30/00*      (2025.01)
*H10D 8/00*       (2025.01)
(Continued)

(52) U.S. Cl.
CPC .......... *H10D 84/811* (2025.01); *H10D 8/045* (2025.01); *H10D 8/422* (2025.01); *H10D 8/60* (2025.01);
(Continued)

(58) Field of Classification Search
CPC .. H10D 30/471; H10D 30/475; H10D 30/015; H10D 84/0107; H10D 84/0109; H10D 84/08
See application file for complete search history.

(56) References Cited

U.S. PATENT DOCUMENTS

2008/0048219 A1    2/2008  Brar et al.
2009/0166677 A1    7/2009  Shibata et al.
(Continued)

FOREIGN PATENT DOCUMENTS

| CN | 111312712 A | 6/2020 |
| JP | 2009-038395 A | 2/2009 |

(Continued)

OTHER PUBLICATIONS

Office Action dated Apr. 24, 2025 in corresponding Japanese patent application No. 2022-547496 (18 pages; with English machine translation).

(Continued)

*Primary Examiner* — Reema Patel
(74) *Attorney, Agent, or Firm* — XSENSUS LLP

(57) ABSTRACT

A semiconductor device includes an electron transit layer formed on first principal surface of the semiconductor layer, an electron supply layer formed on the electron transit layer, a gate conductive layer formed on the electron supply layer, a source conductive layer and a drain conductive layer that are formed on the electron supply layer such that the gate conductive layer is interposed between the source conductive layer and the drain conductive layer, an anode conductive layer that is formed on second principal surface of the semiconductor layer and that is electrically connected to the source conductive layer, a cathode conductive layer that is formed on the first principal surface of the semiconductor layer and that is electrically connected to the drain conductive layer, and a rectifying element formed by a part of the (Continued)

semiconductor layer such that the rectifying element is electrically connected to the anode and cathode conductive layers.

14 Claims, 20 Drawing Sheets

(51) Int. Cl.
  *H10D 8/01* (2025.01)
  *H10D 8/60* (2025.01)
  *H10D 30/01* (2025.01)
  *H10D 30/47* (2025.01)
  *H10D 62/83* (2025.01)
  *H10D 62/85* (2025.01)
  *H10D 84/08* (2025.01)
  *H10D 84/80* (2025.01)

(52) U.S. Cl.
  CPC ......... *H10D 30/015* (2025.01); *H10D 30/475* (2025.01); *H10D 62/83* (2025.01); *H10D 62/8503* (2025.01); *H10D 84/08* (2025.01)

(56) References Cited

U.S. PATENT DOCUMENTS

| | | | |
|---|---|---|---|
| 2009/0189191 A1* | 7/2009 | Sato | H10D 84/01 257/E29.1 |
| 2013/0015498 A1* | 1/2013 | Briere | H10D 62/83 257/191 |
| 2013/0341641 A1 | 12/2013 | Nishiwaki et al. | |

FOREIGN PATENT DOCUMENTS

| | | |
|---|---|---|
| JP | 2009-164158 A | 7/2009 |
| JP | 2013-038409 A | 2/2013 |
| JP | 2019-165172 A | 9/2019 |

OTHER PUBLICATIONS

Office Action issued Oct. 18, 2023 in German Patent Application No. 11 2021 004 164.09 and its informal translation, 12 pages.
International Search Report and Written Opinion mailed on Nov. 9, 2021, received for PCT Application PCT/JP2021/031393, filed on Aug. 26, 2021, 17 pages including English Translation.
Office Action dated Aug. 20, 2025 in corresponding German patent application No. 11 2021 004 164.9 (11 pages; with English translation).

* cited by examiner

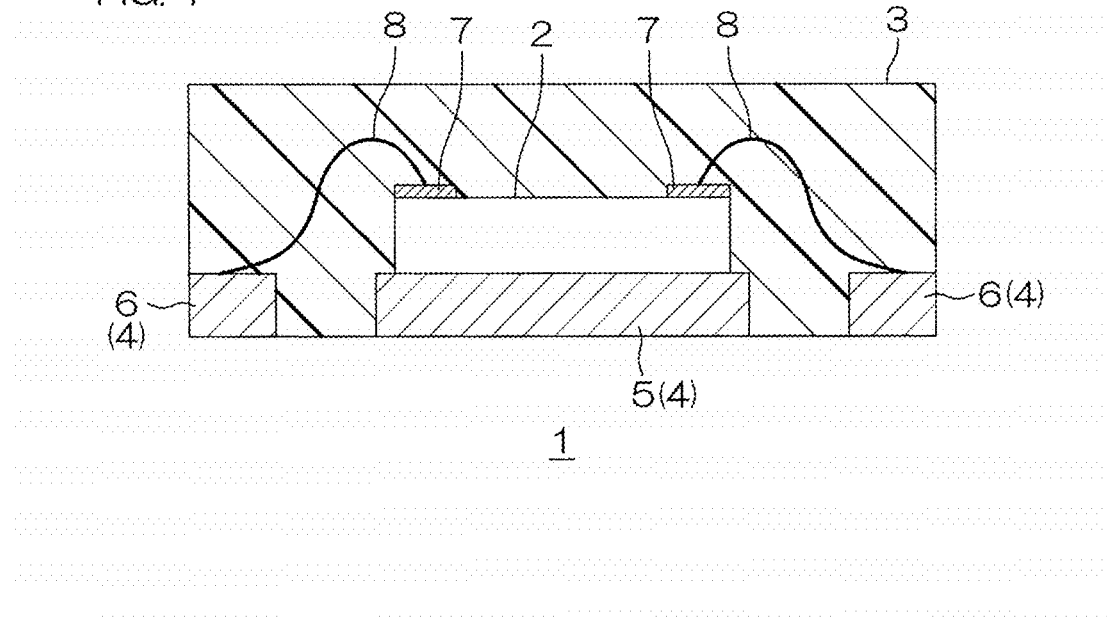
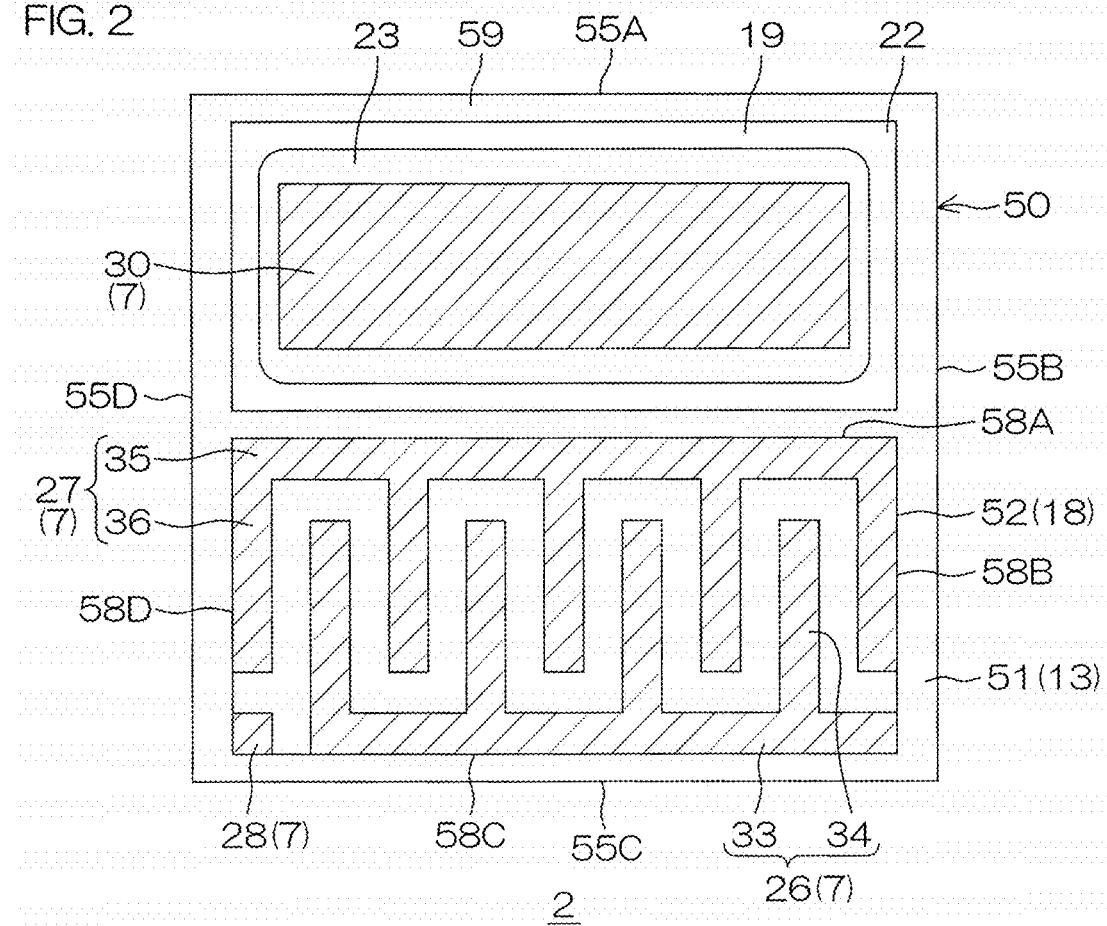

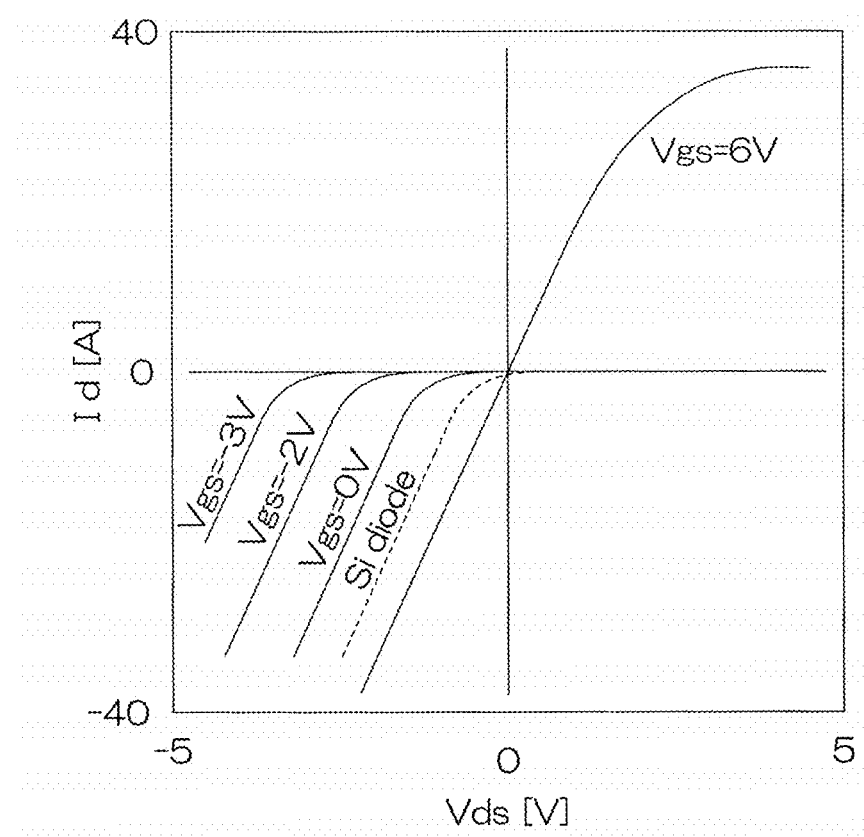

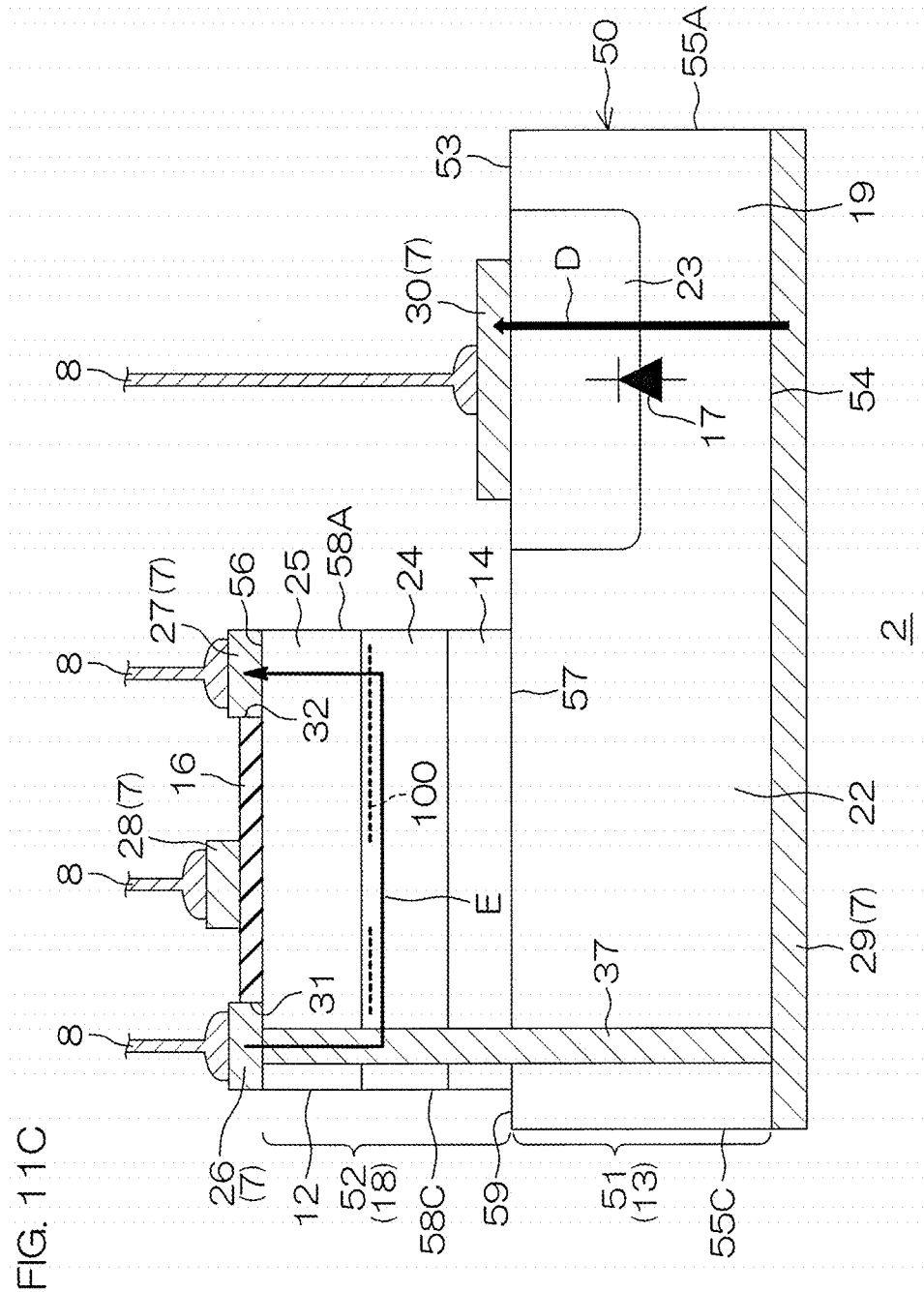

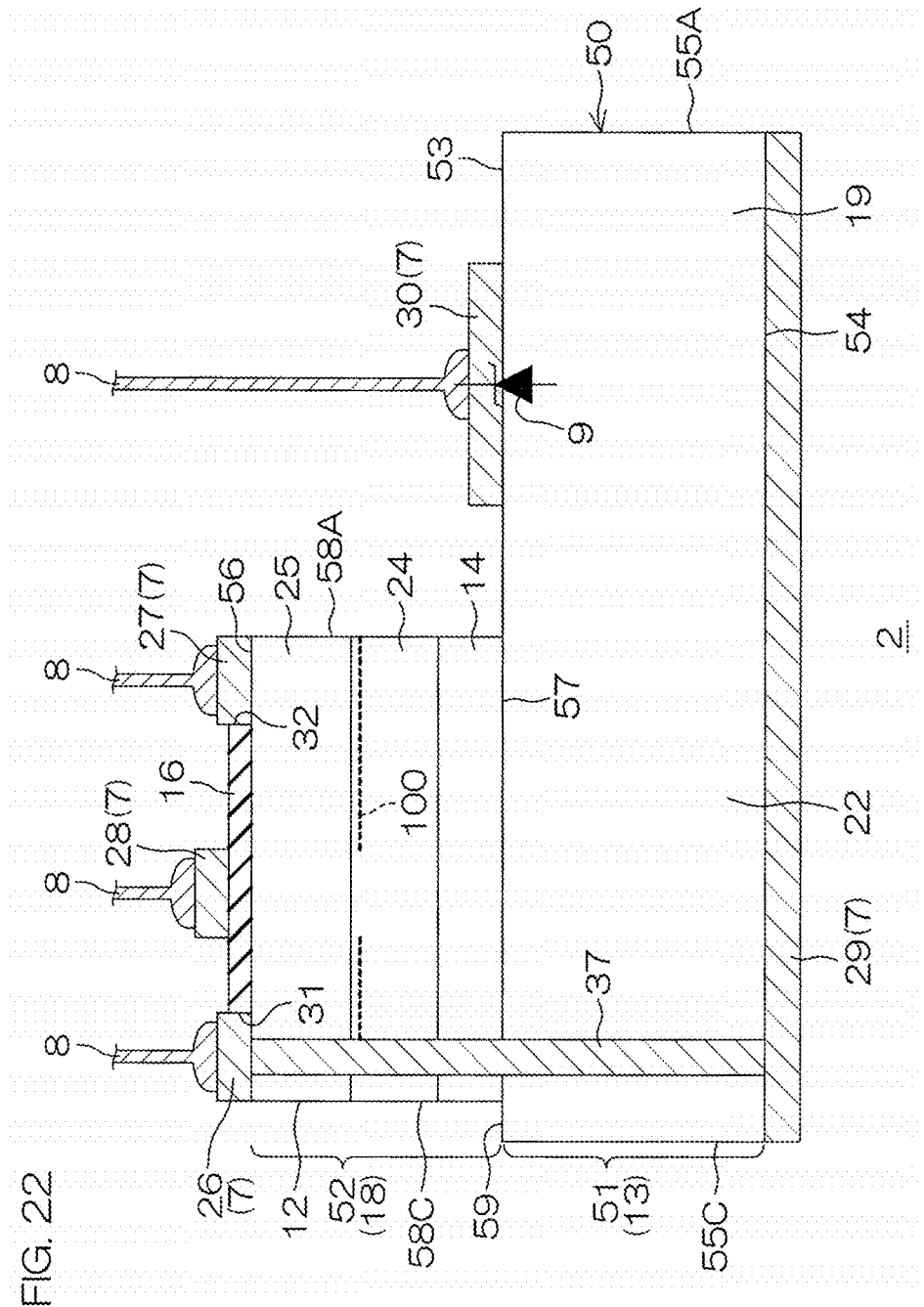

SEMICONDUCTOR DEVICE INCLUDING A SILICON SEMICONDUCTOR LAYER AND A NITRIDE SEMICONDUCTOR LAYER

CROSS-REFERENCE TO RELATED APPLICATIONS

The present application is based on PCT filing PCT/JP2021/031393, filed Aug. 26, 2021, which claims priority to Japanese Patent Application No. 2020-150774, filed Sep. 8, 2020, the entire contents of each are incorporated herein by reference.

TECHNICAL FIELD

The present disclosure relates to a semiconductor device.

BACKGROUND ART

Patent Literature 1 discloses a semiconductor device in which a GaN layer is formed on a substrate for the growth of a nitride semiconductor including an $Al_2O_3$ layer made of aluminum oxide, an AlOxNy layer made of aluminum oxynitride, an AlN layer made of aluminum nitride, and an $Al_2O_3$ cap layer made of aluminum oxide on a silicon substrate made of single-crystal silicon.

CITATION LIST

Patent Literature

Patent Literature 1: Japanese Patent Application Publication No. 2009-38395

SUMMARY OF INVENTION

Solution to Problem

A semiconductor device according to a preferred embodiment of the present disclosure includes a semiconductor layer having a first principal surface and a second principal surface on a side opposite to the first principal surface, an electron transit layer formed on the first principal surface of the semiconductor layer, an electron supply layer formed on the electron transit layer, a gate conductive layer formed on the electron supply layer, a source conductive layer and a drain conductive layer that are formed on the electron supply layer such that the gate conductive layer is interposed between the source conductive layer and the drain conductive layer, an anode conductive layer that is formed on the second principal surface of the semiconductor layer and that is electrically connected to the source conductive layer, a cathode conductive layer that is formed on the first principal surface of the semiconductor layer and that is electrically connected to the drain conductive layer, and a rectifying element formed by a part of the semiconductor layer such that the rectifying element is electrically connected to the anode conductive layer and to the cathode conductive layer.

BRIEF DESCRIPTION OF DRAWINGS

FIG. 1 is a schematic cross-sectional view of a semiconductor device according to a first preferred embodiment of the present disclosure.

FIG. 2 is a plan view of a semiconductor element in the first preferred embodiment of the semiconductor device of FIG. 1.

FIG. 10 is a view showing reverse current characteristics of a semiconductor device and of a Si diode.

FIG. 11C is a view showing a schematic current path of the semiconductor element.

FIG. 22 is a schematic cross-sectional view of a semiconductor element according to an eleventh preferred embodiment of the present disclosure.

DESCRIPTION OF PREFERRED EMBODIMENTS

Preferred Embodiments of Present Disclosure

Figure 3:
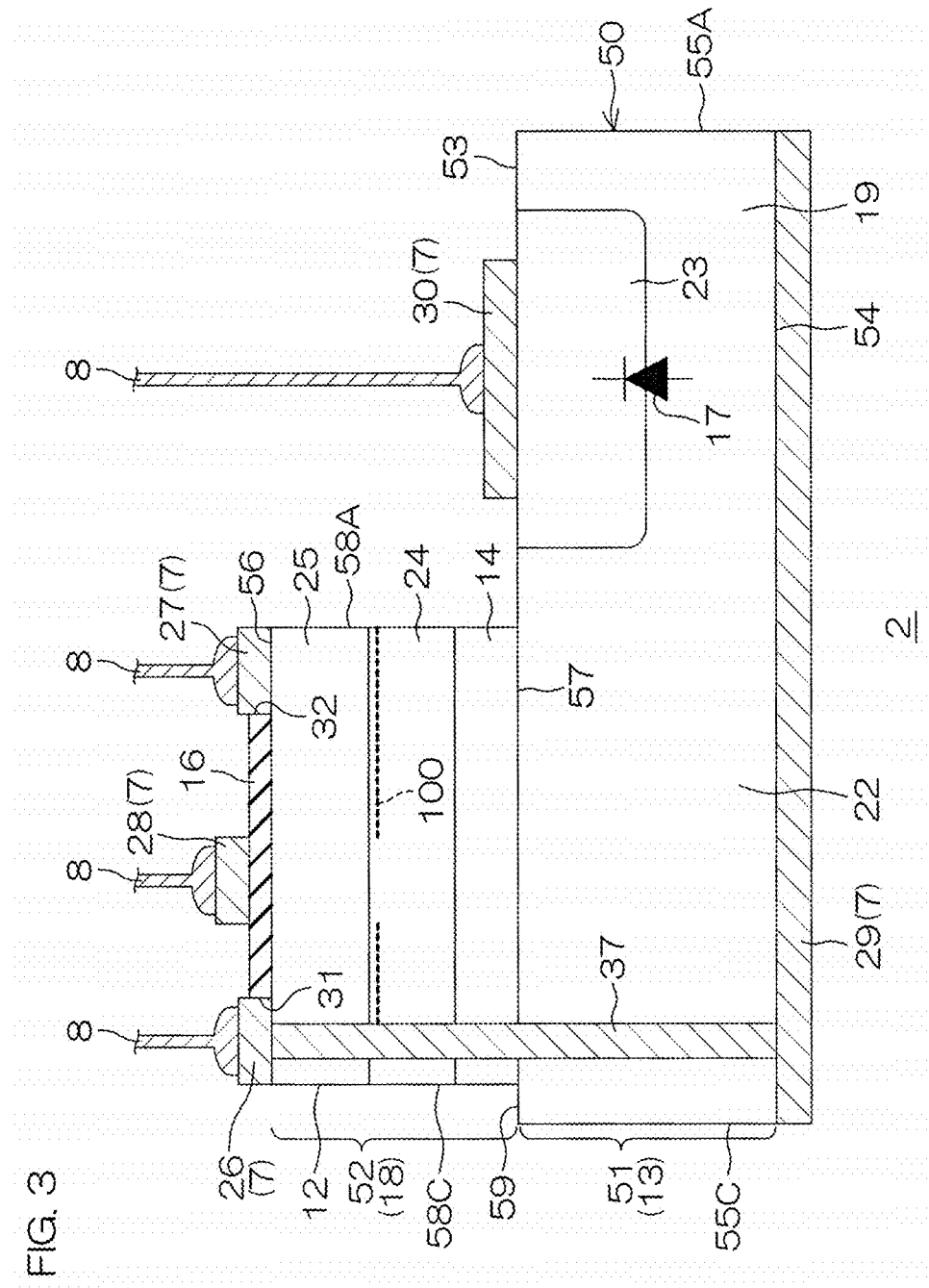
FIG. 3 is a cross-sectional view of the semiconductor element in the first preferred embodiment of the semiconductor device of FIG. 1.

First, a preferred embodiment of the present disclosure will be described in an itemized form.

A semiconductor device according to a preferred embodiment of the present disclosure includes a semiconductor layer having a first principal surface and a second principal surface on a side opposite to the first principal surface, an electron transit layer formed on the first principal surface of the semiconductor layer, an electron supply layer formed on the electron transit layer, a gate conductive layer formed on the electron supply layer, a source conductive layer and a drain conductive layer that are formed on the electron supply layer such that the gate conductive layer is interposed between the source conductive layer and the drain conductive layer, an anode conductive layer that is formed on the second principal surface of the semiconductor layer and that is electrically connected to the source conductive layer, a cathode conductive layer that is formed on the first principal surface of the semiconductor layer and that is electrically connected to the drain conductive layer, and a rectifying element formed by a part of the semiconductor layer such that the rectifying element is electrically connected to the anode conductive layer and to the cathode conductive layer.

With this configuration, the rectifying element that passes an electric current in an opposite direction is formed between the source conductive layer and the drain conductive layer independently of the electron transit layer and the electron supply layer. This makes it possible to secure a path of an electric current flowing from the source conductive layer to the drain conductive layer regardless of the application voltage of the gate conductive layer. As a result, it is possible to provide a semiconductor device having an excellent electrical conduction characteristic of a source-drain current.

Additionally, the rectifying element is formed by use of the semiconductor layer, and therefore it is possible to form a rectifying element having a low forward voltage, and it is possible to provide a semiconductor device having an excellent electrical conduction characteristic of a source-drain current.

Additionally, the anode conductive layer formed on the second principal surface of the semiconductor layer and the source conductive layer are electrically connected, and therefore it is possible to effectively suppress a current collapse of the semiconductor device.

The semiconductor device according to one preferred embodiment of the present disclosure may include a first through wiring that penetrates through the electron supply layer, the electron transit layer, and the semiconductor layer and that connects the source conductive layer and the anode conductive layer.

This makes it possible to reduce wiring resistance between the source conductive layer and the anode conductive layer, hence making it possible to provide a semiconductor device having an excellent electrical conduction characteristic.

In the semiconductor device according to one preferred embodiment of the present disclosure, the cathode conductive layer may include a second through wiring that penetrates through the electron supply layer and the electron transit layer from the drain conductive layer and that is in contact with the first principal surface of the semiconductor layer.

This makes it possible to reduce wiring resistance between the drain conductive layer and the cathode conductive layer, hence making it possible to provide a semiconductor device having an excellent electrical conduction characteristic. Additionally, the drain conductive layer and the cathode conductive layer can be made common, and therefore it is possible to simplify the structure of the semiconductor device.

In the semiconductor device according to one preferred embodiment of the present disclosure, the semiconductor layer may include a silicon semiconductor layer, and the electron transit layer may include a nitride semiconductor layer, and the semiconductor device may additionally include a buffer layer formed between the semiconductor layer and the electron transit layer.

The semiconductor device according to one preferred embodiment of the present disclosure may additionally include an insulation layer formed between the electron supply layer and the gate conductive layer.

In the semiconductor device according to one preferred embodiment of the present disclosure, the rectifying element may include a p-type region that is formed in the semiconductor layer and that is electrically connected to the anode conductive layer and an n-type region that is formed in the semiconductor layer and that is electrically connected to the cathode conductive layer.

In the semiconductor device according to one preferred embodiment of the present disclosure, the rectifying element may include a Schottky junction portion that is formed at the semiconductor layer and that forms a Schottky junction with the cathode conductive layer.

In the semiconductor device according to one preferred embodiment of the present disclosure, the electron supply layer may include a nitride semiconductor layer that differs in Al composition from the electron transit layer.

In the semiconductor device according to one preferred embodiment of the present disclosure, the electron transit layer may include an $Al_{1-X}Ga_XN$ ($0<X\leq1$) layer, and the electron supply layer may include an $Al_{1-X}Ga_XN$ ($0\leq X<1$) layer.

In the semiconductor device according to one preferred embodiment of the present disclosure, the semiconductor layer may include a first region in which the electron transit layer and the electron supply layer are formed in a thickness direction view of the semiconductor layer and a second region in which the rectifying element is formed in the thickness direction view, and the second region may be adjacent to the first region.

In the semiconductor device according to one preferred embodiment of the present disclosure, the second region may be formed along an outer periphery of the first region.

In the semiconductor device according to one preferred embodiment of the present disclosure, the electron transit layer and the electron supply layer may form a laminated structure by being laminated in a region of a part of the first principal surface of the semiconductor layer, and the semiconductor layer may include a rectifying element formation region formed outside the laminated structure in a direction perpendicular to the thickness direction view of the semiconductor layer, and the rectifying element may include a pn junction formed in the rectifying element formation region.

In the semiconductor device according to one preferred embodiment of the present disclosure, the semiconductor layer may include a semiconductor substrate from which regions having mutually identical conductivity types are exposed in the first principal surface and the second principal surface.

Detailed Description of Preferred Embodiments of Present Disclosure

Next, preferred embodiments of the present disclosure will be described in detail with reference to the attached drawings. In the following detailed description, there are a plurality of constituent elements with names having ordinal numbers. However, the ordinal numbers do not necessarily match the ordinal numbers of constituent elements described in the appended Claims.

First Preferred Embodiment

FIG. 1 is a schematic cross-sectional view of a semiconductor device 1 according to a first preferred embodiment of the present disclosure. A structure of the semiconductor device 1 will be described with reference to FIG. 1. The semiconductor device 1 includes a semiconductor element 2, a package 3, and a lead frame 4.

The lead frame 4 is formed in a metallic plate shape. The lead frame 4 is formed by a punching process, a cutout process, a bending process, etc., from a thin metallic plate, such as a Cu plate. Therefore, the material of the lead frame 4 has a main component of Cu. The material of the lead frame 4 is not limited to this.

The lead frame 4 may include a die pad portion 5 and a lead portion 6. The die pad portion 5 supports the semiconductor element 2, and the lead portion 6 is disposed around the die pad portion 5. The lead portion 6 is formed at a distance from the die pad portion 5. The die pad portion 5 and the lead portion 6 are exposed from the package 3. In the present preferred embodiment, a lower surface of the die pad portion 5 and a lower surface of the lead portion 6 are selectively exposed from the package 3. The lead portion 6 has its part connected to an external circuit of the semiconductor device 1, and therefore the lead portion 6 may be referred to as a terminal.

The semiconductor element 2 includes a conductive layer 7. The conductive layer 7 is a member connected to an external circuit when the semiconductor element 2 is connected to the external circuit. Therefore, the conductive layer 7 may be referred to as an electrode layer. The semiconductor element 2 is supported by the die pad portion 5 of the lead frame 4, and is mounted on the die pad portion 5 by a bonding material, such as solder. The semiconductor element 2 is electrically connected to the lead portion 6 by means of a conductive member 8. More specifically, the conductive layer 7 formed at the semiconductor element 2 and the lead portion 6 are connected by the conductive member 8, and, as a result, the semiconductor element 2 is electrically connected to the lead portion 6. In the present preferred embodiment, the conductive member 8 is a metal wire. Therefore, the semiconductor element 2 is electrically connected to the lead portion 6 by wire bonding.

The package 3 covers the semiconductor element 2, the conductive member 8, and a part of the lead frame 4, and may be referred to as a sealing resin. The package 3 is made of a material having insulation properties. In the present preferred embodiment, the package 3 is made of, for example, a black epoxy resin.

A structure of the semiconductor element 2 packaged in the semiconductor device 1 will be described with reference to FIG. 2 and FIG. 3. FIG. 2 and FIG. 3 are views showing a schematic planar structure and a schematic cross-sectional structure, respectively, of the semiconductor element 2.

The semiconductor element 2 is formed in the shape of a chip, and has a quadrangular shape in a plan view. The semiconductor element 2 includes a semiconductor chip 50, an insulation layer 16, and the conductive layer 7.

The semiconductor chip 50 has a two-stage structure including a base portion 51 and a mesa structure portion 52 selectively formed on the base portion 51. The base portion 51 and the mesa structure portion 52 may be each formed in a rectangular parallelepiped shape (a quadrangular shape in a plan view).

The base portion 51 has a first principal surface 53, a second principal surface 54 on the side opposite to the first principal surface 53, and first to fourth side surfaces 55A to 55D surrounding the first principal surface 53 in a plan view. The second principal surface 54 of the base portion 51 may form a rear surface of the semiconductor element 2. On the other hand, the mesa structure portion 52 has a first principal surface 56, a second principal surface 57 on the side opposite to the first principal surface 56, and first to fourth side surfaces 58A to 58D surrounding the first principal surface 56 in a plan view. The first to fourth side surfaces 58A to 58D of the mesa structure portion 52 are formed on an inner side with respect to the first to fourth side surfaces 55A to 55D of the base portion 51. Hence, a level difference 59 is formed between the first to fourth side surfaces 58A to 58D of the mesa structure portion 52 and the first to fourth side surfaces 55A to 55D of the base portion 51.

A part of the level difference 59 may form a lead-out portion 19 in such a manner that a part of the base portion 51 is led out in a lateral direction with respect to the mesa structure portion 52. This lead-out portion 19 may occupy about half the area of the semiconductor element 2 in a plan view. Additionally, a part of the first principal surface 53 of the base portion 51 is exposed by the lead-out portion 19. On the other hand, the mesa structure portion 52 may be an element body portion 18 in which a HEMT structure is formed in the semiconductor element 2. The element body portion 18 excluding the lead-out portion 19 in a plan view may occupy about half the area of the semiconductor element 2 in the same way as the lead-out portion 19.

In the present preferred embodiment, the base portion 51 may be a silicon semiconductor layer 13, and the mesa structure portion 52 may be a nitride semiconductor layer 12.

The silicon semiconductor layer 13 is made of a Si-based semiconductor material, such as Si or SiC. In the present preferred embodiment, the silicon semiconductor layer 13 has a first impurity region 22 including p-type impurities formed in its substantially entire area. A second impurity region 23 including n-type impurities is selectively formed at a surface layer of the lead-out portion 19. The silicon semiconductor layer 13 makes a pn junction by means of the first impurity region 22 and the second impurity region 23. Hence, a diode 17 is formed at the lead-out portion 19 of the silicon semiconductor layer 13.

The nitride semiconductor layer 12 includes a buffer layer 14, a first nitride semiconductor layer 24 that is an example of the electron transit layer of the present disclosure, and a second nitride semiconductor layer 25 that is an example of the electron supply layer of the present disclosure.

The buffer layer 14 is a layer formed to reduce the defect density of, for example, the nitride semiconductor layer 12 formed on the silicon semiconductor layer 13. For example, a difference in the lattice constant exists between Si and GaN, and therefore there is a case in which a transition defect occurs in the nitride semiconductor layer 12 that has grown on the silicon semiconductor layer 13. A configuration having the buffer layer 14 makes it possible to suppress the occurrence of a transition defect in the nitride semiconductor layer 12. The buffer layer 14 may be made of a single AlN film, or may be formed by laminating a plurality of nitride semiconductor films. If the buffer layer 14 is formed by laminating a plurality of nitride semiconductor films, the buffer layer 14 may be constituted of an AlN layer in contact with the silicon semiconductor layer 13, which serves as a first buffer layer, and an AlGaN layer laminated on the first buffer layer, which serves as a second buffer layer. The first buffer layer functions to grow the AlGaN layer having a low Al level, and therefore may be referred to as a seed layer. The second buffer layer may include a first AlGaN layer in contact with the first buffer layer and a second AlGaN layer that is formed on the first AlGaN layer and that is smaller in Al composition than the first AlGaN layer.

If a single AlGaN layer is merely provided between the first buffer layer and the nitride semiconductor layer 12, a difference in the lattice constant between AlGaN and GaN will be large, and therefore there is a possibility that the lattice relaxation of GaN will occur when the nitride semiconductor layer 12 having a large thickness is laminated. Therefore, it becomes difficult to give a sufficient withstand voltage to the semiconductor element 2. As a result, the thickness of the nitride semiconductor layer 12 is restricted, and the degree of freedom of device design becomes small. If compositions of layers are determined so that the layers become smaller in Al composition in proportion to the closeness to the nitride semiconductor layer 12, it is possible to enlarge the lattice constant of the second buffer layer in a stepwise manner from a value near the lattice constant of AlN to a value near the lattice constant of GaN. As a result, it is possible to freely design the thickness of the nitride semiconductor layer 12. Therefore, if the nitride semiconductor layer 12 is designed so as to be thick, it is possible to improve an element withstand voltage.

The first nitride semiconductor layer 24 is formed on the buffer layer 14. The first nitride semiconductor layer 24 includes a semiconductor material whose composition is $Al_{1-X}Ga_XN$ ($0<X\leq1$). The first nitride semiconductor layer 24 may include a first GaN layer that includes much acceptor impurities and that is in contact with the buffer layer 14 and a second GaN layer that hardly includes acceptor impurities and that is formed on the first GaN layer. In this case, the first nitride semiconductor layer 24 may include C (carbon) as an acceptor impurity. The second GaN layer is a layer in which a two-dimensional electron gas 100 is formed, and therefore may be referred to as a conduction path formation layer.

The second nitride semiconductor layer 25 includes a semiconductor material whose composition is $Al_{1-X}Ga_XN$ ($0<X\leq1$). The second nitride semiconductor layer 25 is constituted of a nitride semiconductor whose bandgap is larger than the first nitride semiconductor layer 24. In detail, the second nitride semiconductor layer 25 is constituted of a nitride semiconductor whose Al composition is higher than the first nitride semiconductor layer 24. The first nitride semiconductor layer 24 and the second nitride semiconductor layer 25 are nitride semiconductors that differ in bandgap from each other, and therefore lattice mismatching occurs. Hence, in the first nitride semiconductor layer 24, the two-dimensional electron gas 100 spreads at a position (the second GaN layer) close to an interface between the first nitride semiconductor layer 24 and the second nitride semiconductor layer 25.

The insulation layer 16 is formed in contact with the first principal surface 56 of the mesa structure portion 52. The insulation layer 16 may be constituted of a material having insulation properties, such as $SiO_2$, SiN, SiON, $Al_2O_3$, AlN, AlON, HfO, HfN, HfON, HfSiON, or AlON. Additionally, the insulation layer 16 may be referred to as a gate insulation layer based on its role performed to insulate a gate 28 (described later) and the nitride semiconductor layer 12 from each other.

The conductive layer 7 is electrically connected to the lead portion 6. The conductive layer 7 may include a source 26, a drain 27, the gate 28, an anode 29, and a cathode 30.

The source 26 and the drain 27 are formed on the element body portion 18 via a source contact hole 31 and a drain contact hole 32 provided in the insulation layer 16. The gate 28 is formed on the insulation layer 16. The cathode 30 is formed on the lead-out portion 19. The source 26, the drain 27, the gate 28, and the cathode 30 are divided from each other.

The source 26 may include a source body portion 33 and a source extension portion 34. The source 26 is formed in a comb-teeth shape by means of the source body portion 33 and the source extension portion 34. The source body portion 33 is a region that has a quadrangular shape in a plan view extending in a direction along the third side surface 58C of the element body portion 18 in a plan view. The source extension portion 34 has a quadrangular shape in a plan view extending in a direction along the second side surface 58B and the fourth side surface 58D of the element body portion 18 from the source body portion 33. The source extension portion 34 is provided as a plurality of source extension portions formed at a predetermined distance from each other. The source 26 is formed so as to come into direct contact with the second nitride semiconductor layer 25.

The drain 27 may include a drain body portion 35 and a drain extension portion 36. The drain 27 is formed in a comb-teeth shape by means of the drain body portion 35 and the drain extension portion 36. The drain 27 is disposed so that its comb teeth engage with the source 26. The drain body portion 35 is a region that has a quadrangular shape in a plan view extending in a direction along the first side surface 58A of the element body portion 18 in a plan view. The drain extension portion 36 has a quadrangular shape in a plan view extending in a direction along the second side surface 58B and the fourth side surface 58D of the element body portion 18 from the drain body portion 35. The drain extension portion 36 is provided as a plurality of drain extension portions formed at a predetermined distance from each other. The source extension portion 34 and the drain extension portion 36 adjoin each other in a direction along the first side surface 58A of the semiconductor element 2. The drain 27 is formed so as to come into direct contact with the second nitride semiconductor layer 25.

The gate 28 is a region that has a rectangular shape in a plan view and that is formed at a corner portion of the element body portion 18 in a plan view. The gate 28 is formed on an extension line in a direction in which the source body portion 33 extends and on an extension line in a direction in which the drain extension portion 36 extends. The gate 28 is formed on the insulation layer 16. When the gate 28 is formed on the insulation layer 16, it is possible to apply a higher voltage to the gate 28 than when the gate 28 comes into direct contact with the nitride semiconductor layer 12.

The anode 29 is formed so as to cover the second principal surface 54 of the base portion 51. Therefore, the anode 29 is formed on a surface at which the p-type first impurity region 22 of the silicon semiconductor layer 13 is formed. In the present preferred embodiment, the anode 29 is electrically connected to the source 26 by means of a through electrode 37 that penetrates through the mesa structure portion 52 and through the base portion 51 from the first principal surface 56 of the mesa structure portion 52 to the second principal surface 54 of the base portion 51. When a configuration is employed in which the anode 29 is electrically connected to the source 26, the source 26 and the die pad portion 5 are electrically connected by surface contact by the anode 29, and therefore it is possible to reduce parasitic inductance. This makes it possible to reduce vibrations of a gate voltage caused by parasitic inductance, and to reduce the number of problems, such as malfunction and breakdown, and to provide a semiconductor device having high reliability. Additionally, when a configuration is employed in which the anode 29 is electrically connected to the source 26, the anode 29 and the source 26 of the semiconductor device 1 can be integrated, hence making it possible to prevent an increase in the number of unnecessary external terminals.

The cathode 30 is formed on the first principal surface 53 of the lead-out portion 19.

The diode 17 is formed by a pn junction by the first impurity region 22 of the lead-out portion 19 and the second impurity region 23, the anode 29, and the cathode 30.

Next, a method of manufacturing the semiconductor device 1 will be described with reference to FIG. 4 to FIG. 9. FIG. 4 to FIG. 9 are longitudinal sectional views showing a part of a manufacturing process of the semiconductor device 1 in order of process steps.

Figure 4:
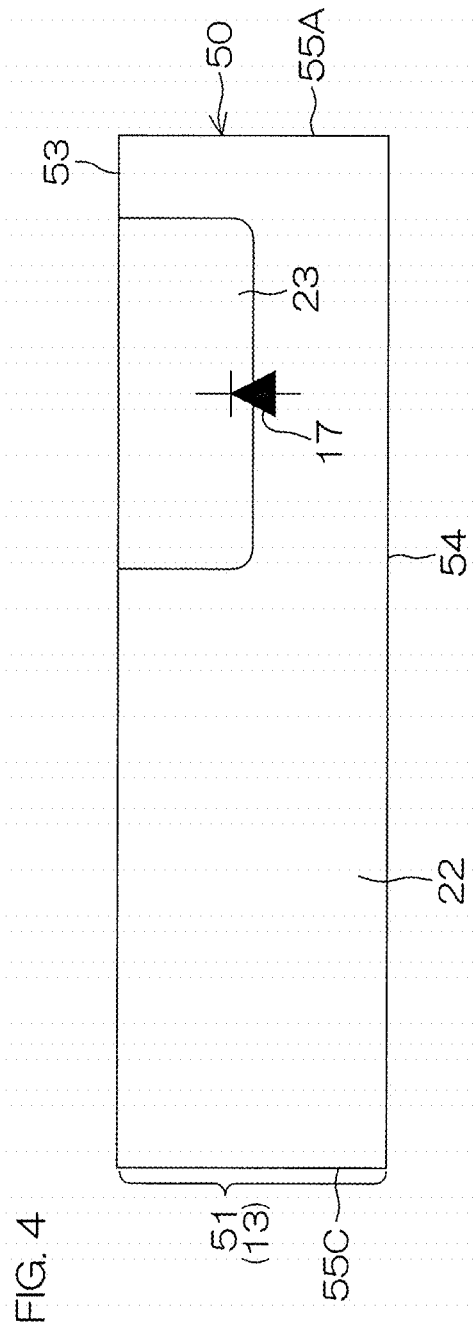
FIG. 4 is a view showing a part of a manufacturing process of the semiconductor element of FIG. 3.

Referring to FIG. 4, the silicon semiconductor layer 13 having the p-type first impurity region 22 is first prepared to manufacture the semiconductor device 1. The silicon semiconductor layer 13 is formed by, for example, adding an acceptor impurity of a trivalent element, such as B (boron), to a Si wafer. Next, a donor impurity of a quinquevalent element, such as P (phosphorus), is added to the first principal surface 53 side of the silicon semiconductor layer 13 according to an impurity diffusing method or an ion implantation method, and, as a result, the second impurity region 23 having an n-type conduction characteristic is formed. Hence, a pn junction is formed at the silicon semiconductor layer 13.

Figure 5:
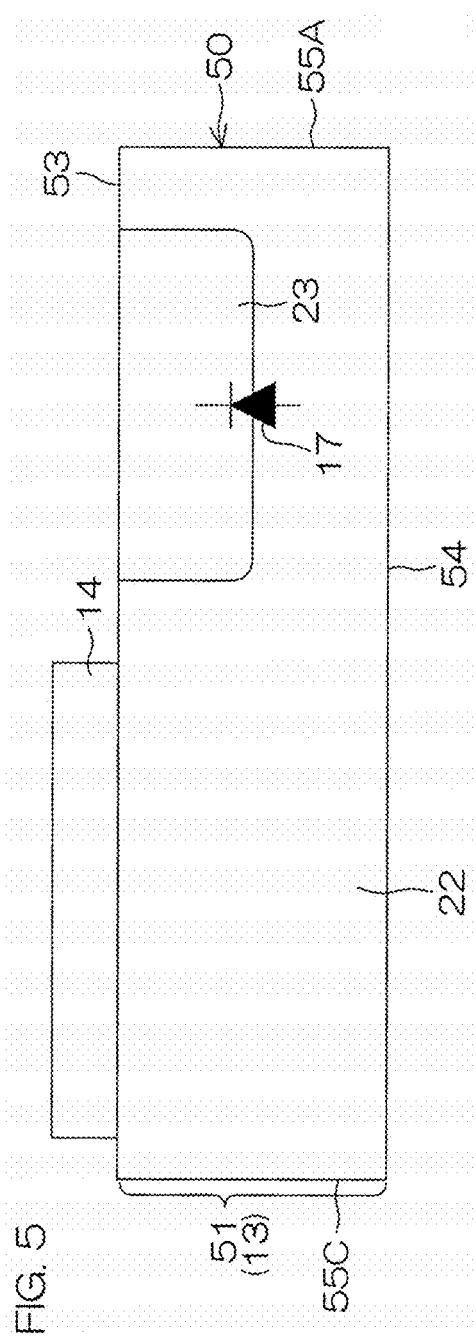
FIG. 5 is a view showing a step subsequent to that of FIG. 4.

Next, referring to FIG. 5, the buffer layer 14 is formed in a region in which the element body portion 18 on the silicon semiconductor layer 13 is to be formed. The buffer layer 14 is epitaxially grown on the element body portion 18 side according to, for example, a MOCVD (Metal Organic Chemical Vapor Deposition) method.

Figure 6:
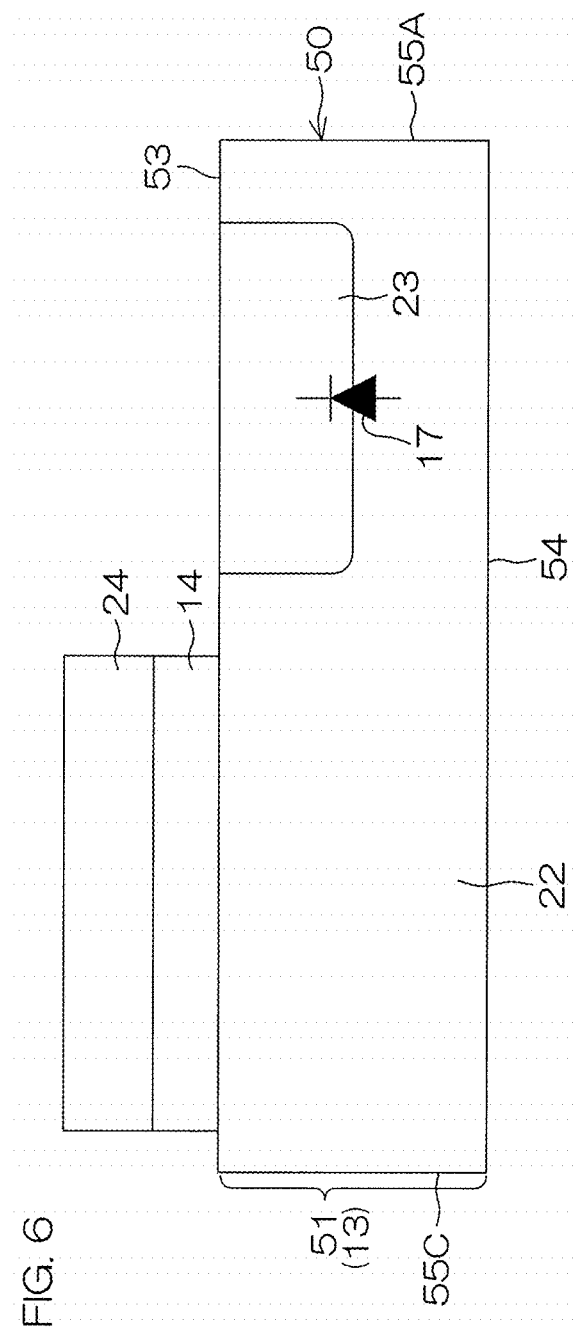
FIG. 6 is a view showing a step subsequent to that of FIG. 5.
Figure 7:
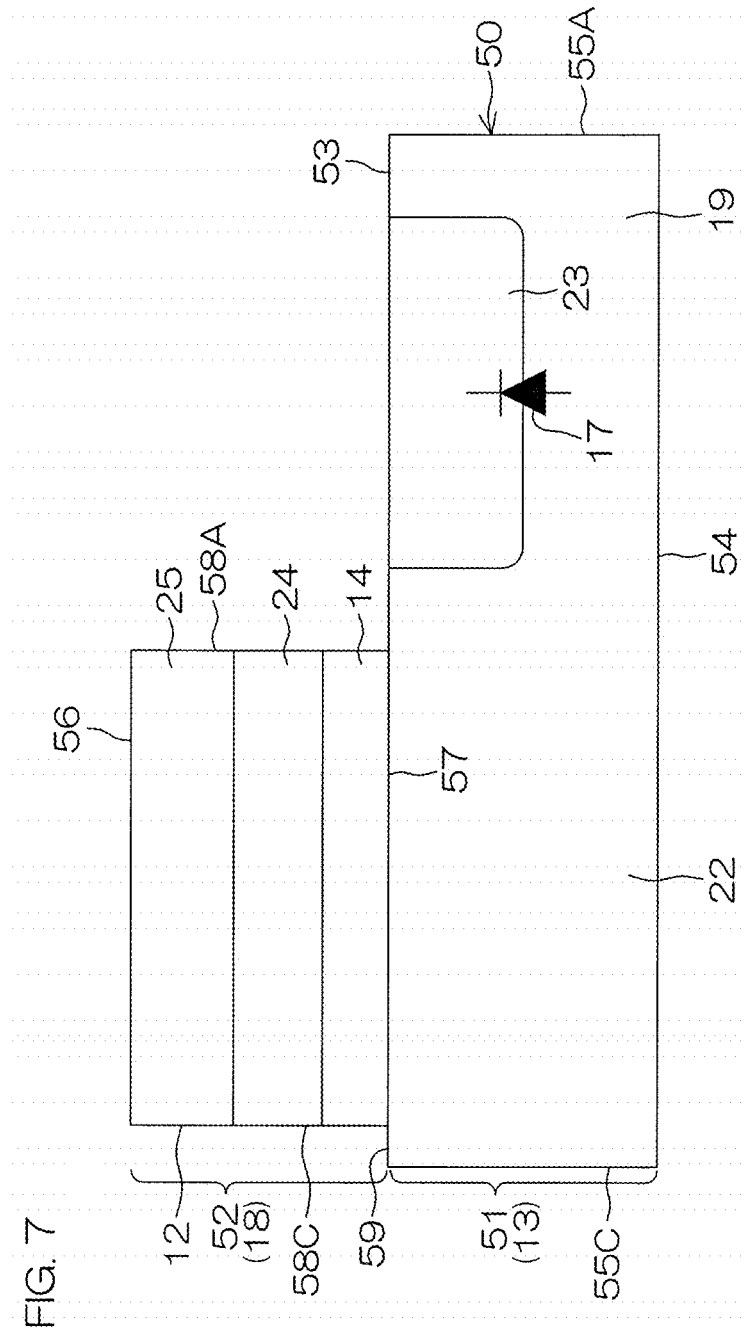
FIG. 7 is a view showing a step subsequent to that of FIG. 6.

Next, referring to FIG. 6 and FIG. 7, the nitride semiconductor layer 12 is formed. The nitride semiconductor layer 12 epitaxially grows the first nitride semiconductor layer 24 on the buffer layer 14 according to, for example, the MOCVD method. Additionally, the second nitride semiconductor layer 25 is formed on the first nitride semiconductor layer 24 according to the MOCVD method.

Figure 8:
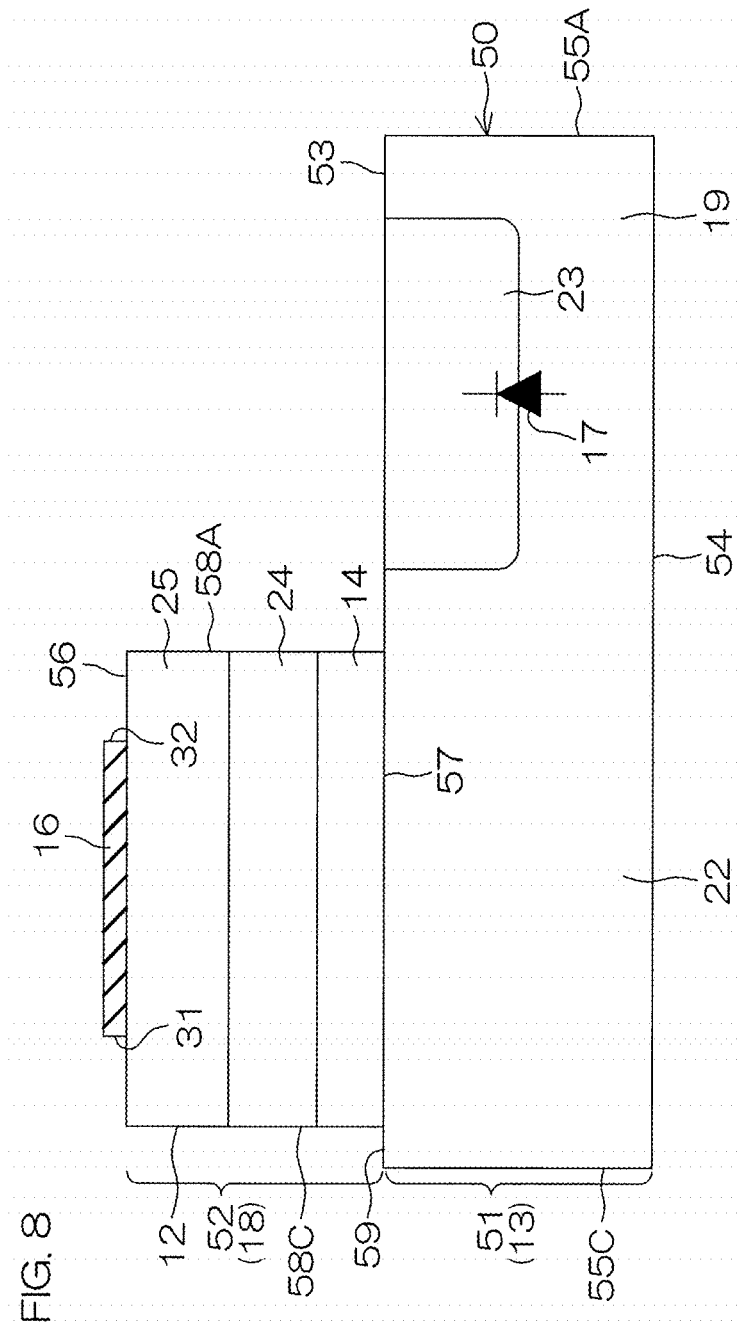
FIG. 8 is a view showing a step subsequent to that of FIG. 7.

Next, referring to FIG. 8, the insulation layer 16 is formed. The insulation layer 16 is formed on the second nitride semiconductor layer 25 according to, for example, a plasma CVD (Chemical Vapor Deposition) method, a LPCVD (Low Pressure CVD) method, an ALD (Atomic Layer Deposition) method, etc. Thereafter, a resist (not shown) is formed in a region on the insulation layer 16 exclusive of a region in which the source contact hole 31 and the drain contact hole 32 are to be formed, and an unnecessary part of the insulation layer 16 is removed by etching, and, as a result, the source contact hole 31 and the drain contact hole 32 are formed. The source contact hole 31 and the drain contact hole 32 penetrate through the insulation layer 16, and reach the second nitride semiconductor layer 25.

Figure 9:
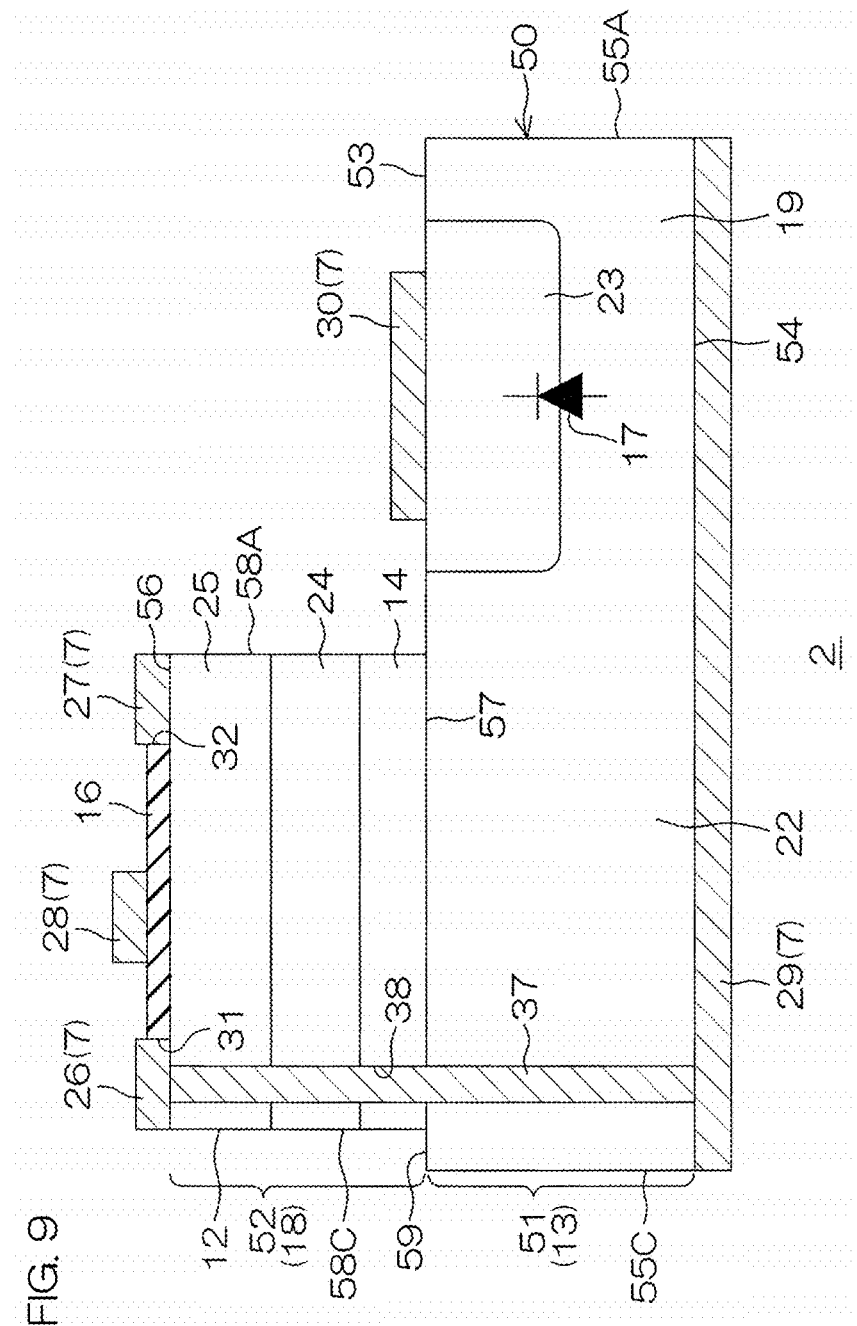
FIG. 9 is a view showing a step subsequent to that of FIG. 8.

Next, referring to FIG. 9, the conductive layer 7 is formed. The material of the conductive layer 7 is laminated on the insulation layer 16 according to, for example, a vapor deposition method, a sputtering method, etc., and then this conductive material is subjected to patterning, and, as a result, the conductive layer 7 is divided into the source 26, the drain 27, the gate 28, and the cathode 30. Additionally, for example, the insulation layer 16 and the nitride semiconductor layer 12 are partially covered with a resist, and are selectively etched, and, as a result, a through hole 38 is formed, and then the through-electrode 37 is formed in the through hole 38 according to the vapor deposition method, the sputtering method, etc. Additionally, the anode 29 is formed at the second principal surface 54 of the base portion 51 according to, for example, the vapor deposition method, the sputtering method, etc., and then a plurality of semiconductor devices 1 are cut out from the silicon semiconductor layer 13. The semiconductor device 1 is manufactured through the process including the above-mentioned steps.

The semiconductor device 1 according to the first preferred embodiment of the present disclosure includes a normally-off type GaN-HEMT (High Electron Mobility Transistor). When a voltage is not applied to the gate 28 in the normally-off type GaN-HEMT, the entirety of an energy band is lifted, and the vicinity of a boundary between the electron transit layer and the electron supply layer becomes higher than the Fermi level, and the two-dimensional electron gas 100 (2DEG: 2-Dimensional Electron Gas) disappears. Thereafter, a positive voltage is applied to the gate 28, and, as a result, the entirety of the energy band is pulled downward, and a two-dimensional electron gas 100 is generated, and a channel is formed between the source and the drain.

FIG. 10 is a view showing examples of a drain voltage vs. drain current characteristic of a normally-off type GaN-HEMT device according to each gate-source voltage and a drain voltage vs. drain current characteristic of a Si diode. The normally-off type GaN-HEMT device is capable of passing a negative drain current (backward current) at a low source-drain voltage when the gate-source voltage is an on voltage (in the drawing, Vgs=6V). However, when the gate-source voltage is an off voltage (in the drawing, Vgs≤0V), the source-drain voltage necessary to pass a backward current becomes higher. As thus described, the backward-current conduction characteristic of the normally-off type GaN-HEMT device is affected by the state of a gate application voltage. The Si diode is capable of passing a backward current with a more excellent characteristic than when an off voltage is applied to the normally-off type GaN-HEMT device.

Figure 11A:
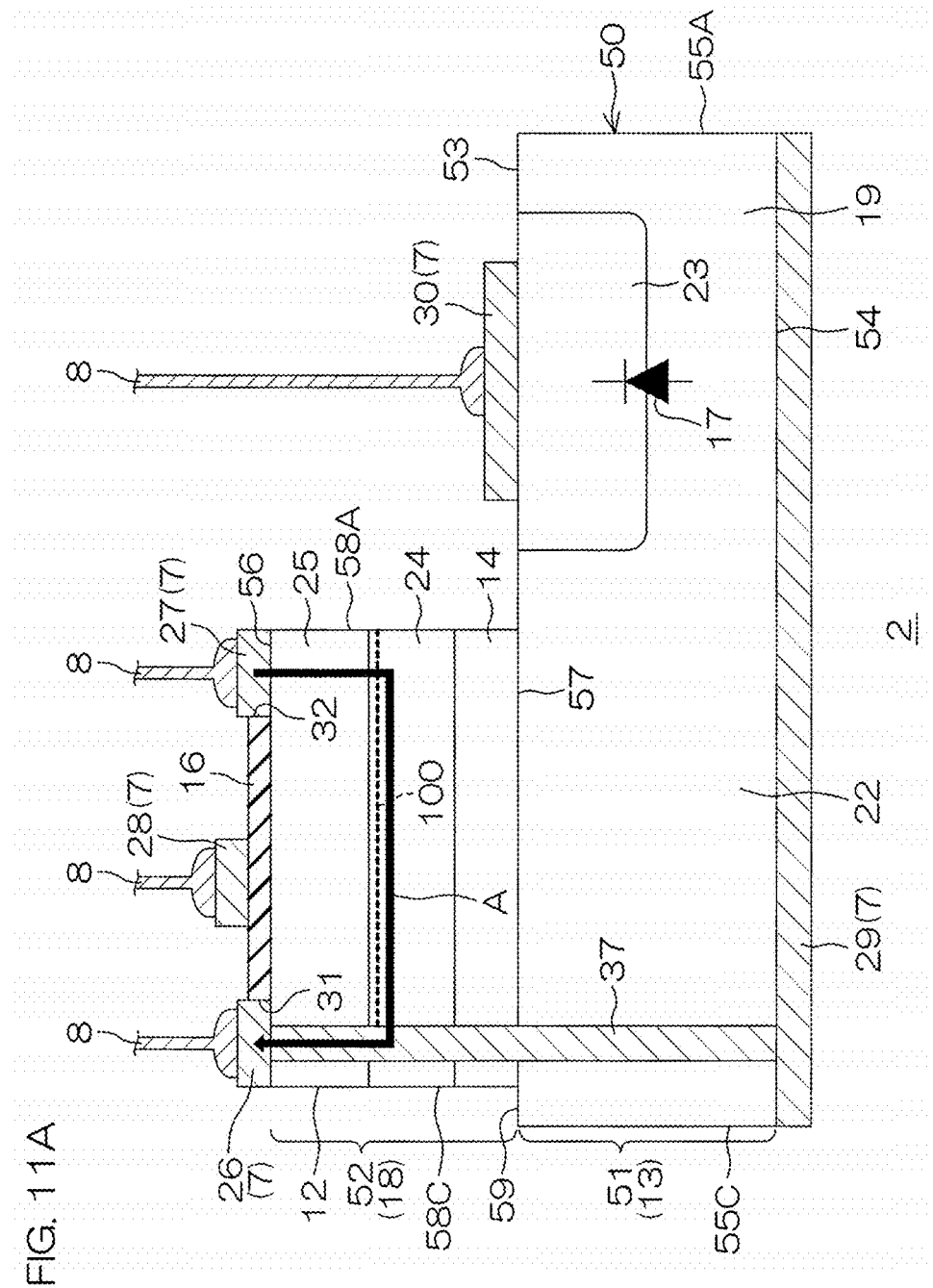
FIG. 11A is a view showing a schematic current path of the semiconductor element.
Figure 11B:
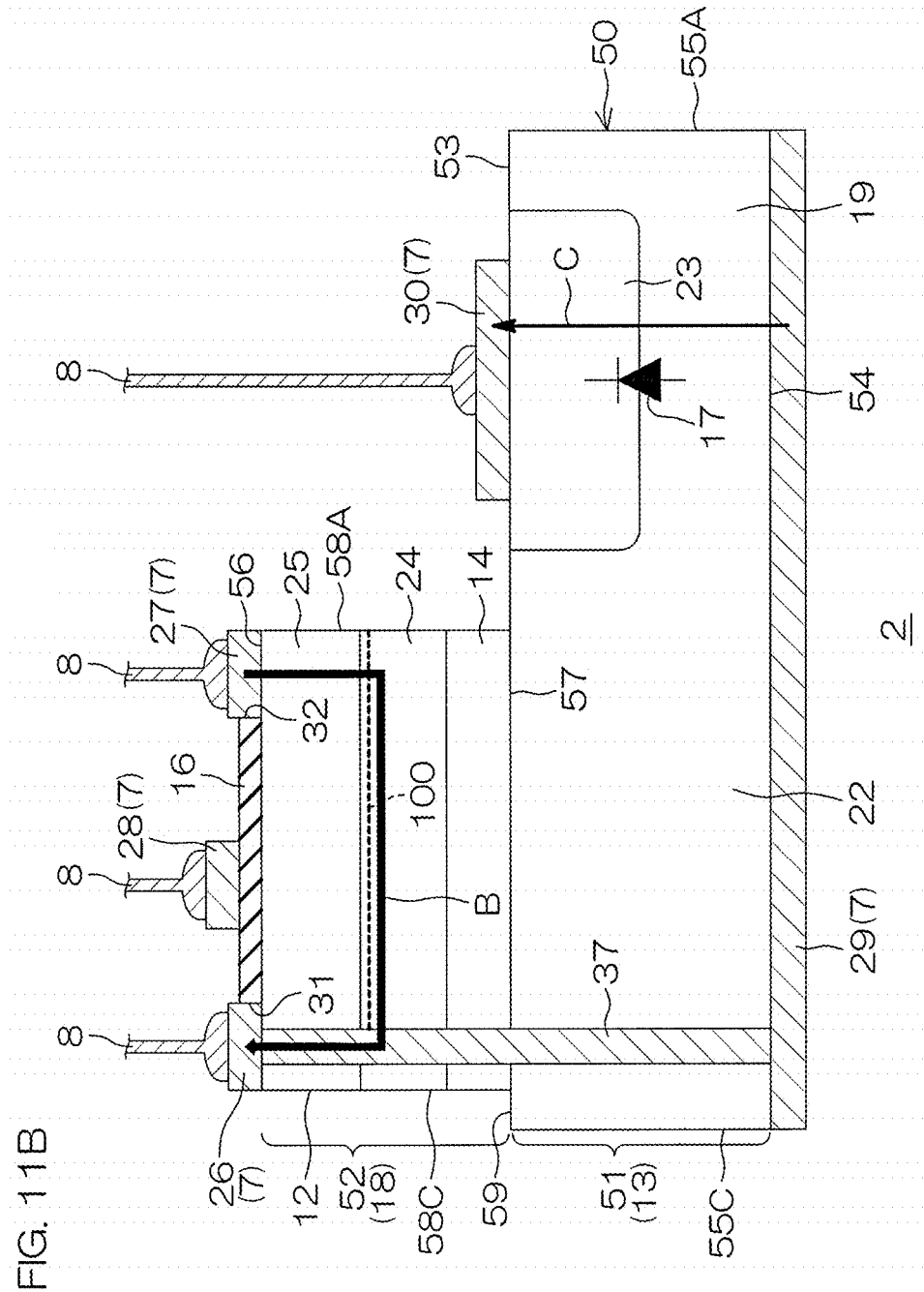
FIG. 11B is a view showing a schematic current path of the semiconductor element.

FIG. 11A to FIG. 11C are schematic views shown to describe a current path of the semiconductor device 1 according to the present preferred embodiment when an on voltage is applied to the gate and when an off voltage is applied to the gate. FIG. 11A shows a path when a drain current (forward current) in the forward direction is passed through the semiconductor device 1 and when an on voltage is applied to the gate 28. In the normally-off type GaN-HEMT device, a forward current flows (arrow A) via the two-dimensional electron gas 100 while using a channel formed at the first nitride semiconductor layer 24 as a main current path when an on voltage is applied to the gate 28. At this time, the forward current follows a direction from the cathode 30 toward the anode 29 of the diode 17, and therefore a current does not flow through the diode 17. Additionally, in the normally-off type GaN-HEMT device, a current does not flow when an off voltage is applied to the gate 28 because a channel is not formed at the first nitride semiconductor layer 24 (not shown). Additionally, a forward current follows a direction from the cathode 30 toward the anode 29 of the diode 17 in the same way as the case of FIG. 11A, and therefore a current does not flow through the diode 17.

FIG. 11B shows a path when a backward current is passed through the semiconductor device 1 and when an on voltage is applied to the gate 28. In the normally-off type GaN-HEMT device, the conduction characteristic of the backward current is more excellent than the Si diode when an on voltage is applied to the gate 28 as shown in FIG. 10. Therefore, a backward current flows via the two-dimensional electron gas 100 (arrow B) while using a channel formed at the first nitride semiconductor layer 24 as a main current path when an on voltage is applied to the gate 28. At this time, the backward current follows a direction from the anode 29 toward the cathode 30 of the diode 17, and therefore the diode 17 serves as a secondary current path, and an electric current smaller than that in the normally-off type GaN-HEMT flows (arrow C).

FIG. 11C shows a path when a backward current is passed through the semiconductor device 1 and when an off voltage is applied to the gate 28. As shown in FIG. 10, the Si diode has a more excellent conduction characteristic of the backward current than that of the normally-off type GaN-HEMT device when an off voltage is applied to the gate 28. The backward current follows a direction from the anode 29 toward the cathode 30 of the diode 17, and therefore a backward current flows while using the diode 17 as a main current path when an off voltage is applied to the gate 28 (arrow D). At this time, in the normally-off type GaN-HEMT device, an electric current smaller than that in the diode 17 flows while using the normally-off type GaN-HEMT device as a secondary current path (arrow E). Therefore, it is possible to provide a semiconductor device 1 capable of excellently passing a backward current even when an off voltage is applied to the normally-off type GaN-HEMT device.

Second Preferred Embodiment

Figure 12:
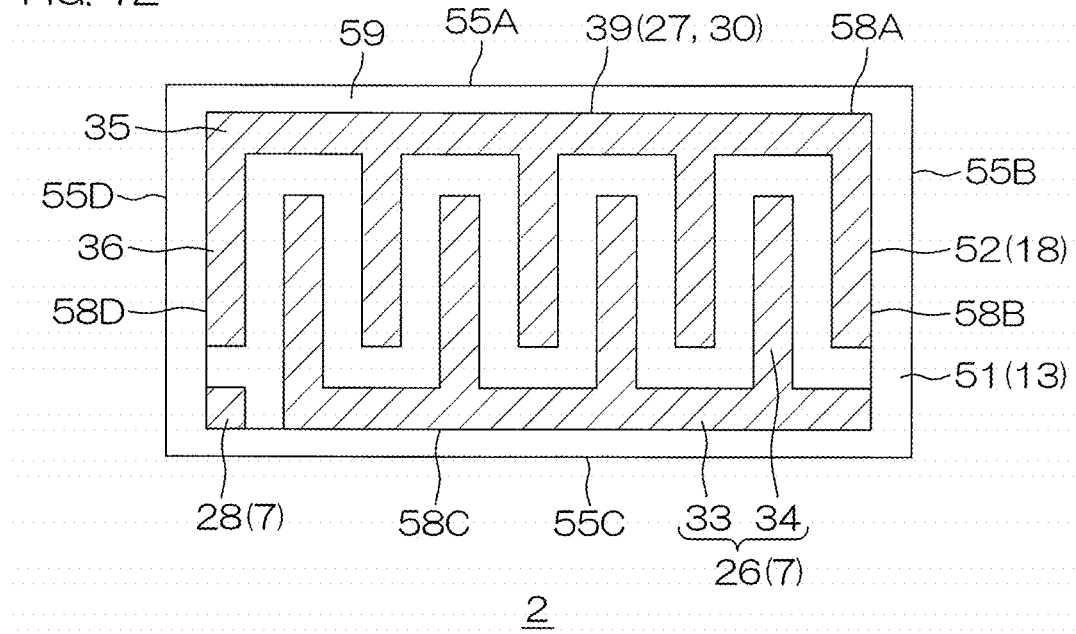
FIG. 12 is a schematic plan view of a semiconductor element according to a second preferred embodiment of the present disclosure.
Figure 13:
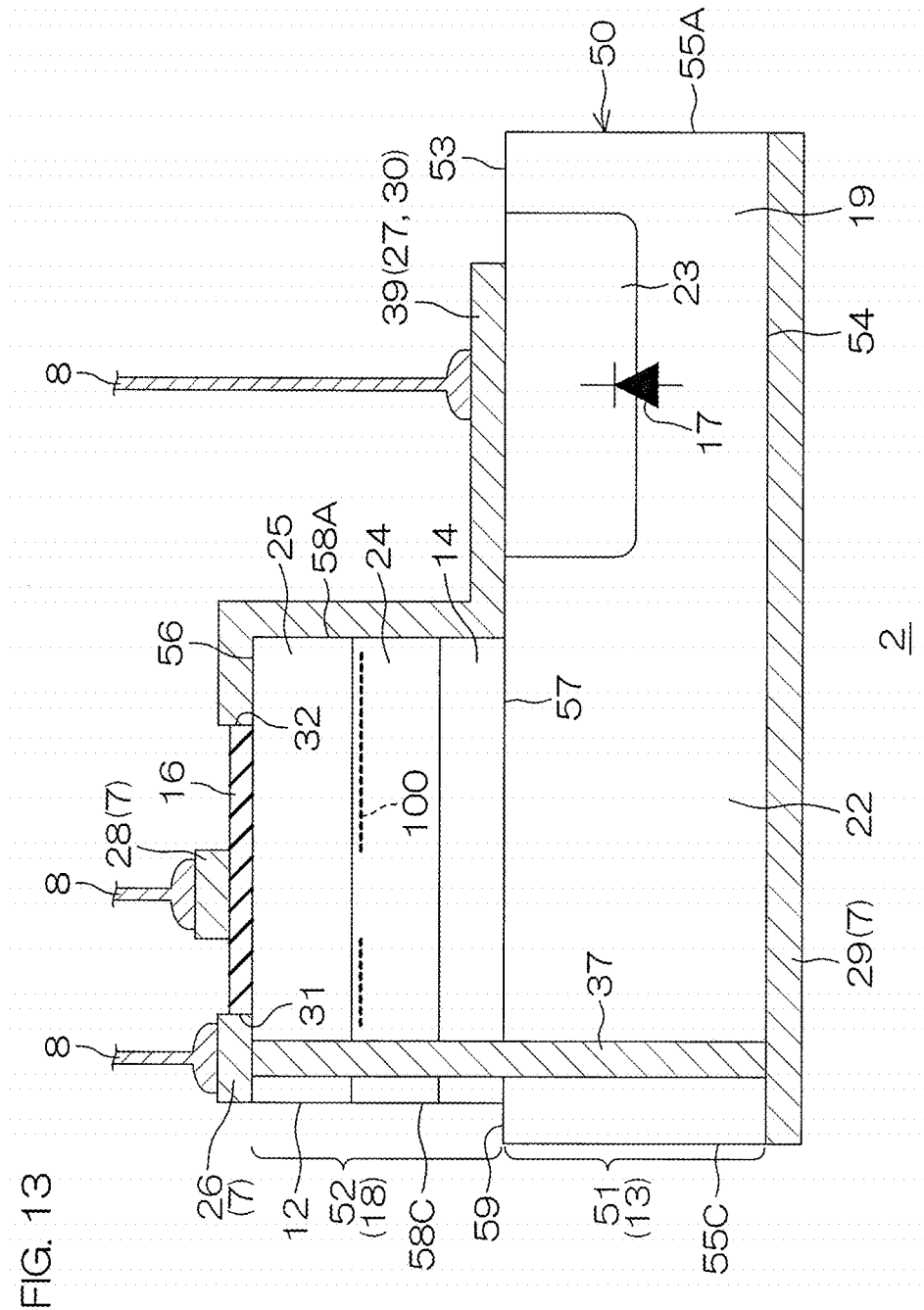
FIG. 13 is a schematic cross-sectional view of the semiconductor element according to the second preferred embodiment of the present disclosure.

FIG. 12 and FIG. 13 are a schematic plan view and a schematic cross-sectional view, respectively, of a semiconductor element 2 according to a second preferred embodiment.

A cross-sectional structure of the semiconductor element 2 according to the present preferred embodiment is different from that of the semiconductor element 2 according to the first preferred embodiment in that the drain 27 and the cathode 30 are replaced by a common electrode 39, but is identical in the other respects, and therefore only a structure of the common electrode 39 will be described.

The common electrode 39 is an electrode in which the drain 27 and the cathode 30 are formed integrally with each other.

The common electrode 39 is formed so as to straddle between the element body portion 18 and the lead-out portion 19. If a configuration having the common electrode 39 is employed, the drain 27 and the cathode 30 of the semiconductor element 2 can be integrated with each other, hence making it possible to prevent an increase in the number of unnecessary external terminals.

Third Preferred Embodiment

Figure 14:
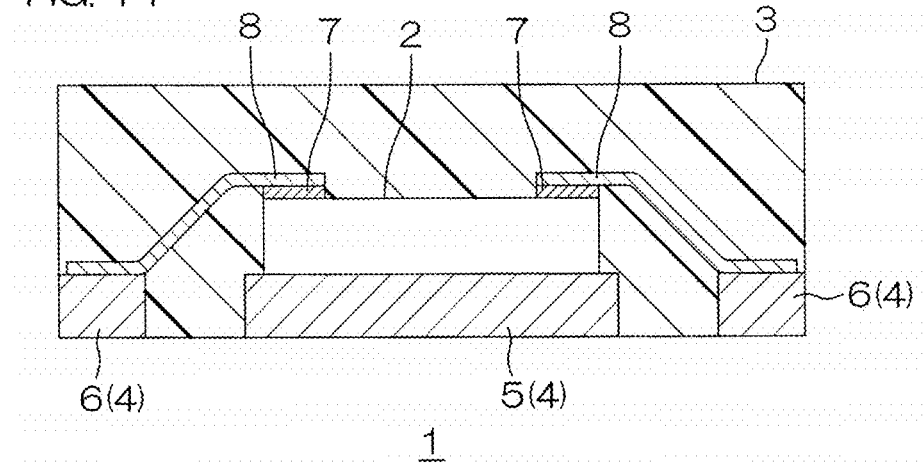
FIG. 14 is a schematic cross-sectional view of a semiconductor device according to a third preferred embodiment of the present disclosure.

FIG. 14 is a schematic cross-sectional view of a semiconductor device 1 according to a third preferred embodiment of the present disclosure.

The semiconductor device 1 according to the third preferred embodiment is identical with the semiconductor device 1 according to the first preferred embodiment in the basic structure, but is different in the configuration of the conductive member 8. Therefore, only the conductive member 8 will be described.

The semiconductor element 2 is electrically connected to the lead portion 6 by means of the conductive member 8. More specifically, the conductive layer 7 formed at the semiconductor element 2 and the lead portion 6 are connected by means of the conductive member 8, and, as a result, the semiconductor element 2 is electrically connected to the lead portion 6. In the present preferred embodiment, the conductive member 8 is electrically connected to the lead portion 6 by clip bonding made by a metallic clip.

Fourth Preferred Embodiment

Figure 15:
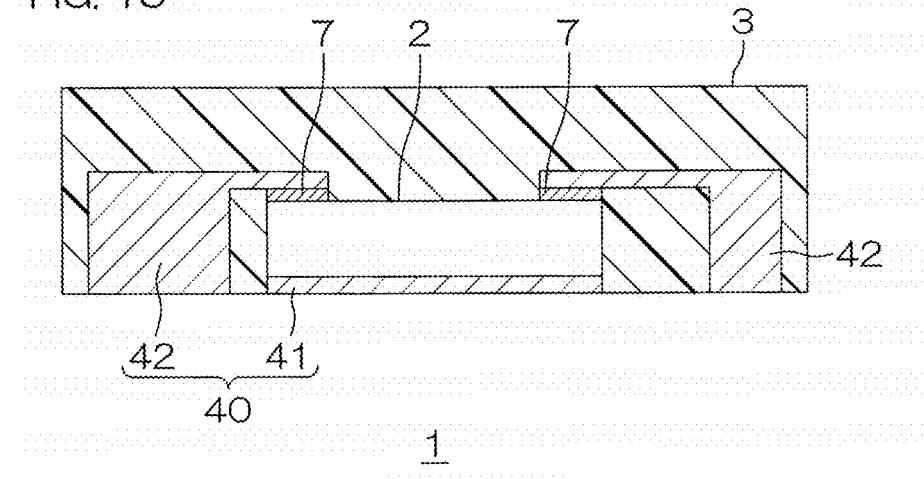
FIG. 15 is a schematic cross-sectional view of a semiconductor device according to a fourth preferred embodiment of the present disclosure.

FIG. 15 is a schematic cross-sectional view of a semiconductor device 1 according to a fourth preferred embodiment of the present disclosure.

The semiconductor device 1 according to the fourth preferred embodiment is different from the semiconductor device 1 according to the first preferred embodiment in that the semiconductor device 1 according to the fourth preferred embodiment does not have the lead frame 4. In the fourth preferred embodiment, the semiconductor device 1 has a Cu wire 40 instead of the lead frame 4.

The Cu wire 40 includes a first Cu wire 41 and a second Cu wire 42. The semiconductor element 2 is supported by the first Cu wire 41. The conductive member 8 is made of the second Cu wire 42. Therefore, the conductive layer 7 formed at the semiconductor element 2 is connected to the second Cu wire 42. Additionally, the second Cu wire 42 is exposed outwardly from the package 3, and the second Cu wire 42 functions as a member that is connected to an external circuit when the semiconductor element 2 is connected to the external circuit.

Fifth Preferred Embodiment

Figure 16:
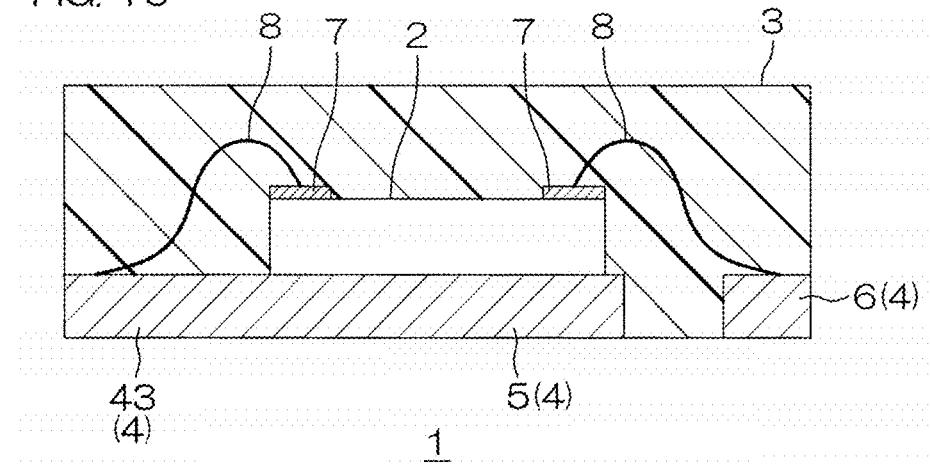
FIG. 16 is a schematic cross-sectional view of a semiconductor device according to a fifth preferred embodiment of the present disclosure.

FIG. 16 is a schematic cross-sectional view of a semiconductor device 1 according to a fifth preferred embodiment of the present disclosure.

The semiconductor device 1 according to the fifth preferred embodiment is identical with the semiconductor device 1 according to the first preferred embodiment in the basic structure, but is different in the configuration of the lead frame 4. Therefore, only the lead frame 4 will be described.

The lead portion 6 includes a source lead 43 that is connected to the source 26 (conductive layer 7) of the semiconductor element 2 by means of the conductive member 8. In the fifth preferred embodiment, the die pad portion 5 is formed integrally with the source lead 43.

Sixth Preferred Embodiment

Figure 17:
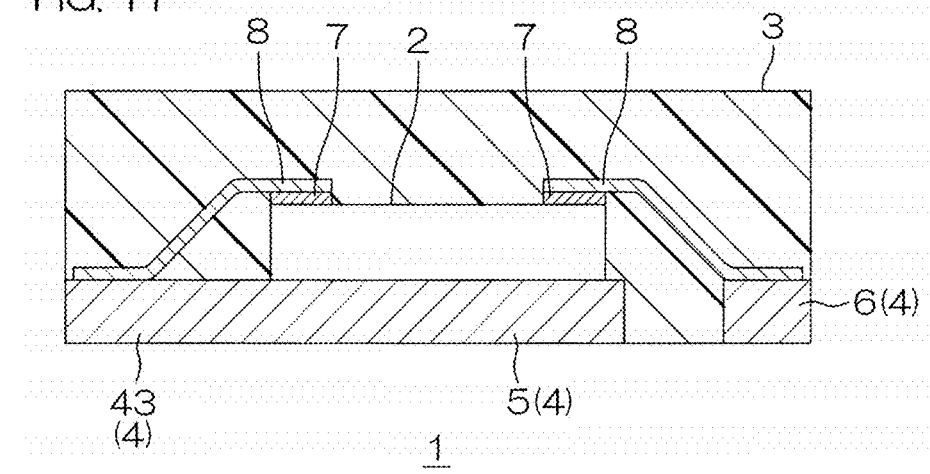
FIG. 17 is a schematic cross-sectional view of a semiconductor device according to a sixth preferred embodiment of the present disclosure.

FIG. 17 is a schematic cross-sectional view of a semiconductor device 1 according to a sixth preferred embodiment of the present disclosure.

The semiconductor device 1 according to the sixth preferred embodiment is identical with the semiconductor device 1 according to the third preferred embodiment in the basic structure, but is different in the configuration of the lead frame 4. Therefore, only the lead frame 4 will be described.

The lead portion 6 includes a source lead 43 that is connected to the source 26 (conductive layer 7) of the semiconductor element 2 by means of the conductive member 8. In the sixth preferred embodiment, the die pad portion 5 is formed integrally with the source lead 43.

Seventh Preferred Embodiment

Figure 18:
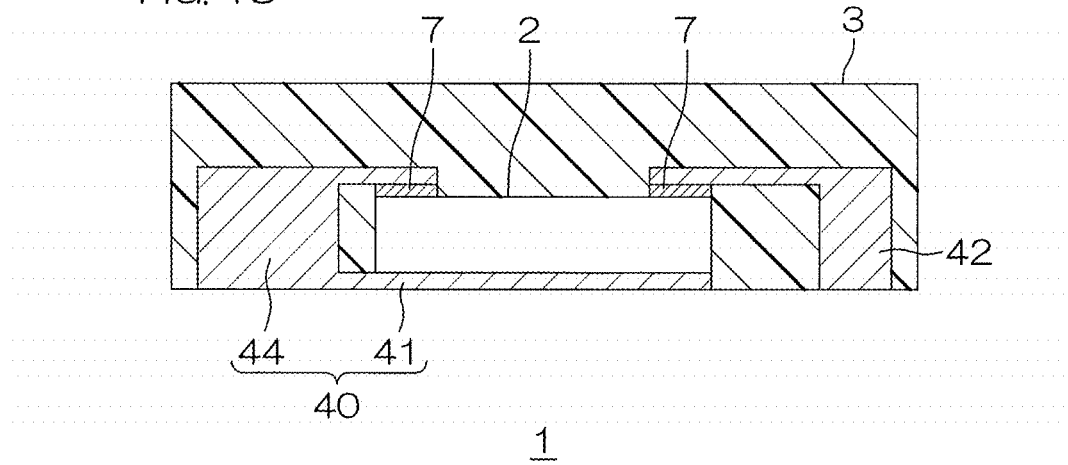
FIG. 18 is a schematic cross-sectional view of a semiconductor device according to a seventh preferred embodiment of the present disclosure.

FIG. 18 is a schematic cross-sectional view of a semiconductor device 1 according to a seventh preferred embodiment of the present disclosure.

The semiconductor device 1 according to the seventh preferred embodiment is identical with the semiconductor device 1 according to the fourth preferred embodiment in the basic structure, but is different in the configuration of the Cu wire 40. Therefore, only the Cu wire 40 will be described.

The Cu wire 40 includes a source wire 44 that is connected to the source 26 of the semiconductor element. In the seventh preferred embodiment, the first Cu wire 41 is formed integrally with the source wire 44.

Eighth Preferred Embodiment

Figure 19:
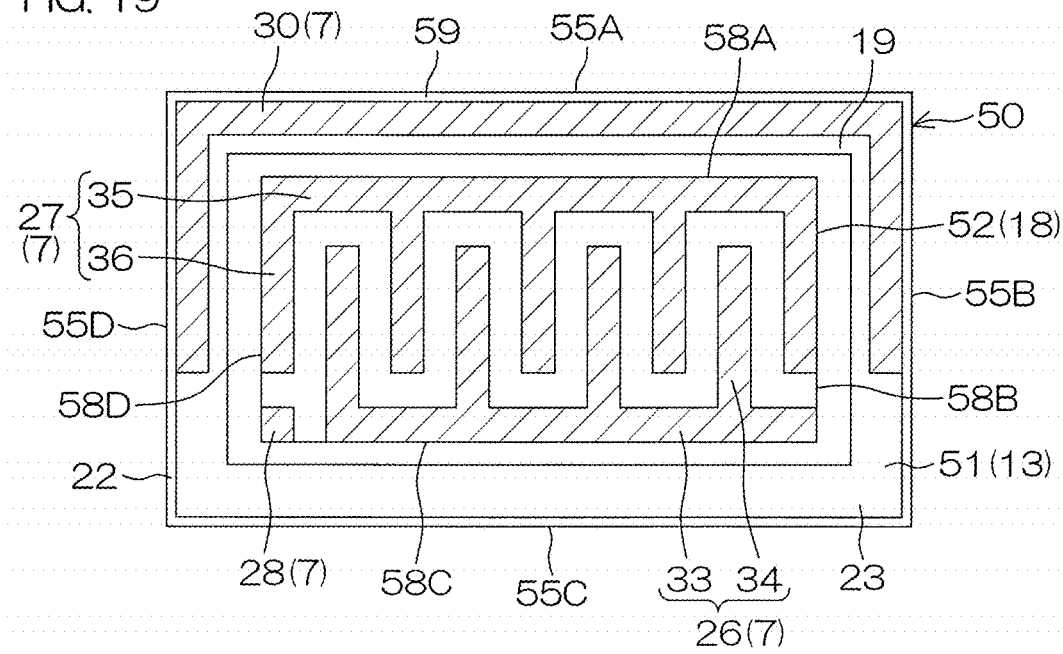
FIG. 19 is a schematic plan view of a semiconductor element according to an eighth preferred embodiment of the present disclosure.

Next, a planar structure of the semiconductor element 2 according to an eighth preferred embodiment of the present disclosure will be described with reference to FIG. 19.

The planar structure of the semiconductor element 2 according to the present preferred embodiment is different from that of the semiconductor element 2 according to the first preferred embodiment in the aspect of the element body portion 18, the lead-out portion 19, and the cathode 30, but is identical in the other respects, and therefore only the element body portion 18, the lead-out portion 19, and the cathode 30 will be described.

In this preferred embodiment, the lead-out portion 19 is formed at an outer periphery of the element body portion 18. Therefore, a configuration is formed in which the element body portion 18 is surrounded by the lead-out portion 19. Additionally, the second impurity region 23 is formed in an annular shape surrounding the element body portion 18 in a plan view. The cathode 30 is formed so as to enclose the drain 27 on the lead-out portion 19. Additionally, the cathode 30 is formed so as to enclose a part of the element body portion 18.

Ninth Preferred Embodiment

Figure 20:
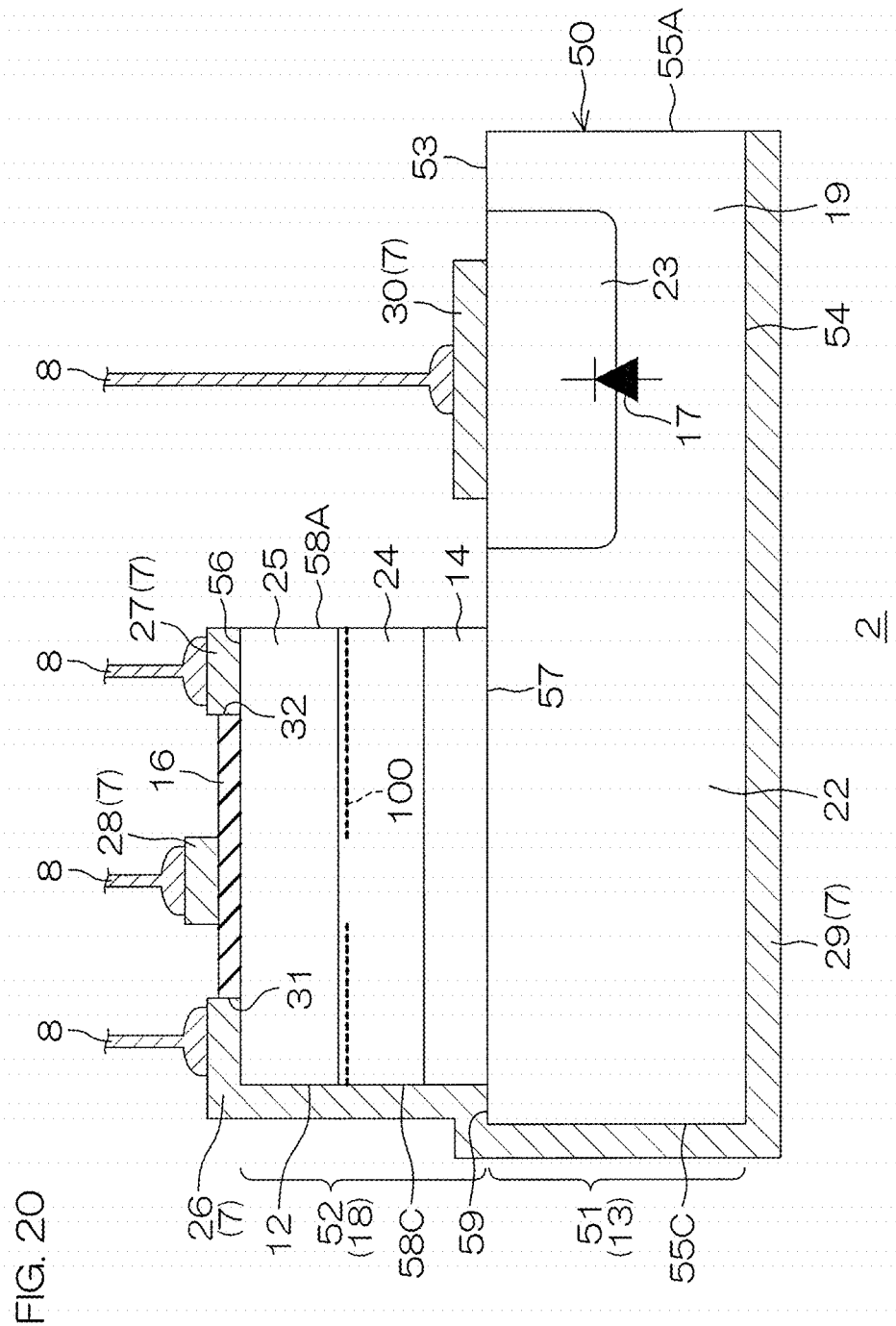
FIG. 20 is a schematic cross-sectional view of a semiconductor element according to a ninth preferred embodiment of the present disclosure.

Next, a cross-sectional structure of the semiconductor element 2 according to a ninth preferred embodiment of the present disclosure will be described with reference to FIG. 20.

The cross-sectional structure of the semiconductor element 2 according to this preferred embodiment is different from that of the semiconductor element 2 according to the first preferred embodiment in the connection aspect of the source 26 and the anode 29, but is identical in the other respects, and therefore only the source 26 and the anode 29 will be described. In this preferred embodiment, the source 26 is connected to the anode 29 along the third side surface 58C of the element body portion 18 and along the third side surface 55C of the silicon semiconductor layer 13.

Tenth Preferred Embodiment

Figure 21:
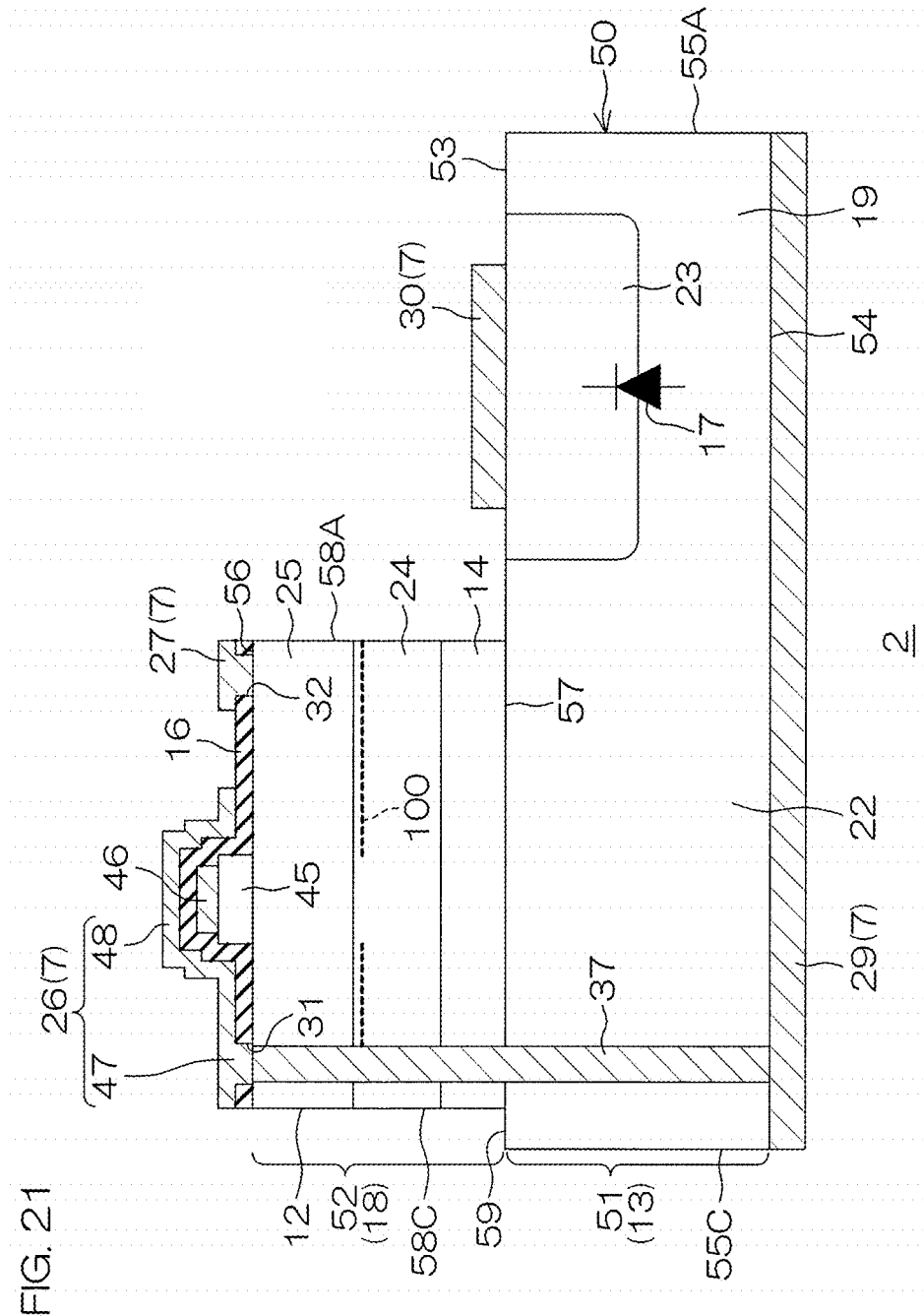
FIG. 21 is a schematic cross-sectional view of a semiconductor element according to a tenth preferred embodiment of the present disclosure.

Next, a cross-sectional structure of a semiconductor element 2 according to a tenth preferred embodiment of the present disclosure will be described with reference to FIG. 21.

The cross-sectional structure of the semiconductor element 2 according to this preferred embodiment is different from that of the semiconductor element 2 according to the first embodiment in the structure of the insulation layer 16, the source 26, and the gate 28, but is identical in the other respects, and therefore only the structure of the insulation layer 16, the source 26, and the gate 28 will be described.

In this preferred embodiment, the gate 28 includes a nitride semiconductor portion 45 and a gate conductive portion 46. The nitride semiconductor portion 45 is formed in contact with the second nitride semiconductor layer 25. The nitride semiconductor portion 45 includes GaN to which acceptor type impurities are added. If a configuration is employed in which the gate 28 includes the nitride semiconductor portion 45, it is possible to offset a two-dimensional electron gas 100 generated in an interface between the first nitride semiconductor layer 24 and the second nitride semiconductor layer 25 in a region immediately under the gate 28. The gate conductive portion 46 is formed on the nitride semiconductor portion 45.

The insulation layer 16 comes into contact with an upper surface of the second nitride semiconductor layer 25, and covers side surfaces of the nitride semiconductor portion 45 and side surfaces and a front surface of the gate conductive portion 46. The insulation layer 16 may be constituted of a material having insulation properties, such as $SiO_2$, SiN, SiON, $Al_2O_3$, AlN, AlON, HfO, HfN, HfON, HfSiON, or AlON.

The source 26 includes a source body portion 47 and a source field plate portion 48. The source body portion 47 is formed in contact with the nitride semiconductor layer 12. The source field plate portion 48 is extended from the source body portion 47, and covers the gate 28 via the insulation layer 16. If a configuration having the source field plate portion 48 is employed, it is possible to relax electric-field concentration on an end of the source 26, hence making it possible to provide a semiconductor device having high reliability.

Eleventh Preferred Embodiment

Next, a cross-sectional structure of a semiconductor element 2 according to an eleventh preferred embodiment of the present disclosure will be described with reference to FIG. 22.

The semiconductor element 2 according to the eleventh preferred embodiment is different from the semiconductor element 2 according to the first preferred embodiment in that the second impurity region 23 is not formed. In this preferred embodiment, the diode 17 may be a Schottky barrier diode 9 formed by a Schottky junction between the silicon semiconductor layer 13 and the cathode 30.

The preferred embodiments of the present disclosure have been described as above, and yet the present disclosure can be embodied in other modes.

For example, the element body portion 18 of the semiconductor chip 50 is made of only the nitride semiconductor layer 12 as described in the above preferred embodiments, and yet a part of the element body portion 18 may be made of the silicon semiconductor layer 13. In other words, a boundary between the nitride semiconductor layer 12 and the silicon semiconductor layer 13 may be not necessarily required to coincide with a boundary between the base portion 51 and the mesa structure portion 52, and may be placed at a position between both ends in the thickness direction of the element body portion 18 (mesa structure portion 52).

Additionally, constituent elements of each of the preferred embodiments can be combined within the scope of the subject matter described in the appended Claims.

Besides, various design changes can be made within the scope of the subject matter described in the appended Claims.

REFERENCE SIGNS LIST

1: semiconductor device
2: semiconductor element
3: package
4: lead frame
5: die pad portion
6: lead portion
7: conductive layer
8: conductive member
9: Schottky barrier diode
12: nitride semiconductor layer
13: silicon semiconductor layer
14: buffer layer
15: conductive layer
16: insulation layer
17: diode
18: element body portion
19: lead-out portion
22: first impurity region
23: second impurity region
24: first nitride semiconductor layer
25: second nitride semiconductor layer
26: source
27: drain
28: gate
29: anode
30: cathode
31: source contact hole
32: drain contact hole
33: source body portion
34: source extension portion
35: drain body portion
36: drain extension portion
37: through electrode
38: through hole
39: common electrode
40: Cu wire
41: first Cu wire
42: second Cu wire
43: source lead
44: source wire
45: nitride semiconductor portion
46: gate conductive portion
47: source body portion
48: source field plate portion
50: semiconductor chip
51: base portion
52: mesa structure portion
53: (base portion) first principal surface
54: (base portion) second principal surface
55A: (base portion) first side surface
55B: (base portion) second side surface
55C: (base portion) third side surface
55D: (base portion) fourth side surface
56: (mesa structure portion) first principal surface
57: (mesa structure portion) second principal surface
58A: (mesa structure portion) first side surface
58B: (mesa structure portion) second side surface
58C: (mesa structure portion) third side surface
58D: (mesa structure portion) fourth side surface
59: level difference
100: two-dimensional electron gas

The invention claimed is:

1. A semiconductor device comprising:
a semiconductor layer having a first principal surface and a second principal surface on a side opposite to the first principal surface, the semiconductor layer including a silicon semiconductor layer;
an electron transit layer formed on the first principal surface of the semiconductor layer, the electron transit layer including a nitride semiconductor layer;
an electron supply layer formed on the electron transit layer;
a gate conductive layer formed on the electron supply layer;
a source conductive layer and a drain conductive layer that are formed on the electron supply layer such that the gate conductive layer is interposed between the source conductive layer and the drain conductive layer;
an anode conductive layer that is formed on the second principal surface of the semiconductor layer and that is electrically connected to the source conductive layer;
a cathode conductive layer that is formed on the first principal surface of the semiconductor layer and that is electrically connected to the drain conductive layer;
a rectifying element formed by a part of the semiconductor layer such that the rectifying element is electrically connected to the anode conductive layer and to the cathode conductive layer; and
a buffer layer formed between the semiconductor layer and the electron transit layer, wherein
the electron transit layer and the electron supply layer form a laminated structure by being laminated in a region of a part of the first principal surface of the semiconductor layer, and
the semiconductor layer includes a rectifying element formation region formed outside the laminated structure in a direction perpendicular to a thickness direction view of the semiconductor layer where the first principal surface of the silicon semiconductor layer is exposed, and
the rectifying element is formed in the rectifying element formation region.

2. The semiconductor device according to claim 1, further comprising a first through wiring that penetrates through the electron supply layer, the electron transit layer, and the semiconductor layer and that connects the source conductive layer and the anode conductive layer.

3. The semiconductor device according to claim 1, wherein the cathode conductive layer includes a second through wiring that penetrates through the electron supply layer and the electron transit layer from the drain conductive layer and that is in contact with the first principal surface of the semiconductor layer.

4. The semiconductor device according to claim 1, further comprising an insulation layer formed between the electron supply layer and the gate conductive layer.

5. The semiconductor device according to claim 1, wherein the rectifying element includes a p-type region that is formed in the semiconductor layer and that is electrically connected to the anode conductive layer and an n-type region that is formed in the semiconductor layer and that is electrically connected to the cathode conductive layer.

6. The semiconductor device according to claim 1, wherein the rectifying element includes a Schottky junction portion that is formed at the semiconductor layer and that forms a Schottky junction with the cathode conductive layer.

7. The semiconductor device according to claim 1, wherein the electron supply layer includes a nitride semiconductor layer that differs in Al composition from the electron transit layer.

8. The semiconductor device according to claim 7, wherein the electron transit layer includes an $Al_{1-X}Ga_XN$ ($0<X\leq1$) layer, and the electron supply layer includes an $Al_{1-X}Ga_XN$ ($0\leq X<1$) layer.

9. The semiconductor device according to claim 1, wherein the semiconductor layer includes:
   a first region in which the electron transit layer and the electron supply layer are formed in a thickness direction view of the semiconductor layer; and
   a second region in which the rectifying element is formed in the thickness direction view, and
   wherein the second region is adjacent to the first region.

10. The semiconductor device according to claim 9, wherein the second region is formed along an outer periphery of the first region.

11. The semiconductor device according to claim 1, wherein
   the rectifying element includes a pn junction formed in the rectifying element formation region.

12. The semiconductor device according to claim 1, wherein the semiconductor layer includes a semiconductor substrate from which regions having mutually identical conductivity types are exposed in the first principal surface and the second principal surface.

13. The semiconductor device according to claim 1, wherein
   the rectifying element formation region includes a lead-out portion formed by a part of the semiconductor layer led out in a lateral direction with respect to the laminated structure, and
   the lead-out portion forms at least a part of side surfaces of the semiconductor layer.

14. The semiconductor device according to claim 13, wherein
   the cathode conductive layer has an outer edge spaced inward from a periphery of the lead-out portion, and
   a part of the lead-out portion is exposed from the cathode conductive layer.

* * * * *